United States Patent
Leyonhjelm et al.

(10) Patent No.: US 6,973,135 B1
(45) Date of Patent: Dec. 6, 2005

(54) REDUCED DELAY IMPLEMENTATION OF FOURIER TRANSFORM BASED CHANNELIZERS AND DE-CHANNELIZERS

(75) Inventors: Scott Leyonhjelm, Sundbyberg (SE); Richard Hellberg, Huddinge (SE); Joakim Eriksson, Sundbyberg (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 809 days.

(21) Appl. No.: 09/610,612

(22) Filed: Jul. 5, 2000

Related U.S. Application Data

(60) Provisional application No. 60/142,909, filed on Jul. 9, 1999.

(51) Int. Cl.[7] .......................... H04L 23/02; H04B 7/216
(52) U.S. Cl. ...................... 375/261; 375/262; 375/263; 375/265; 370/342; 370/343
(58) Field of Search ............................... 375/347, 349, 375/360; 455/132, 133; 370/480–490

(56) References Cited

U.S. PATENT DOCUMENTS 4,893,266 A * 1/1990 Deem .......................... 708/405
6,266,687 B1 * 7/2001 Leyonhjelm et al. ....... 708/420
6,334,219 B1 * 12/2001 Hill et al. .................... 725/106

FOREIGN PATENT DOCUMENTS

FR      2 095 512      2/1974

OTHER PUBLICATIONS

Jae Beom Lee et al., "Transform Domain Filtering Based on Pipelining Structure" IEEE Transactions on Signal Processing, US, IEEE, New York, vol. 40, No. 8, Aug. 1992.

* cited by examiner

Primary Examiner—Jay K. Patel
Assistant Examiner—Qutub Ghulamali
(74) Attorney, Agent, or Firm—Roger Burleigh

(57) ABSTRACT

In a wireless telecommunications system, data processing delays associated with digital channelization and de-channelization may be reduced through the use of a technique that involves processing data blocks in conjunction with the transformation of the data blocks by a large, Fast Fourier Transform (FFT) algorithm, and makes use of multiple transmission and reception branches. In accordance with this technique, the processing delays associated with the FFT algorithm are minimized, but not to the detriment of other important channelizer/de-channelizer design characteristics, such as power consumption, die area and computational complexity.

19 Claims, 28 Drawing Sheets

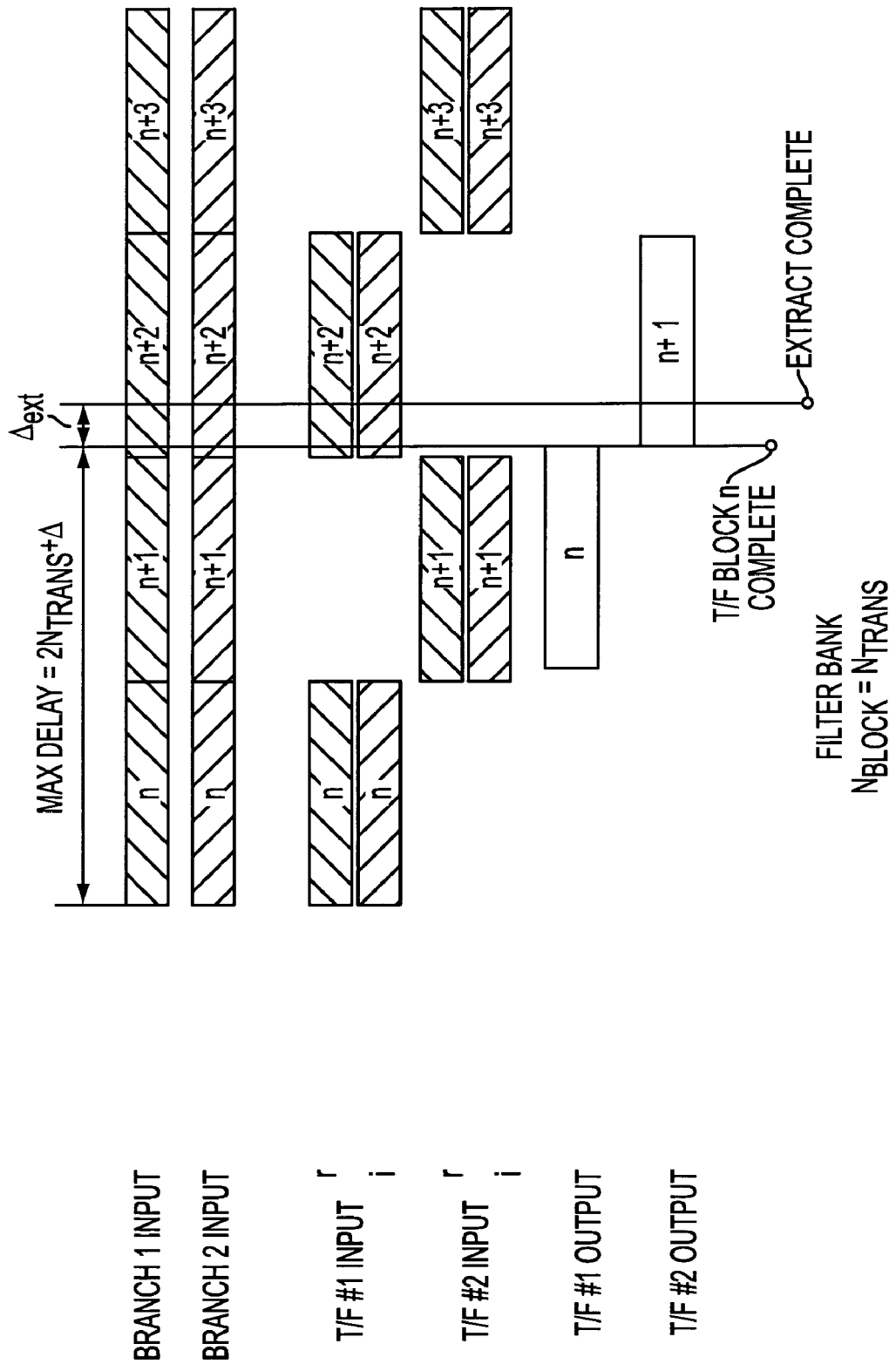

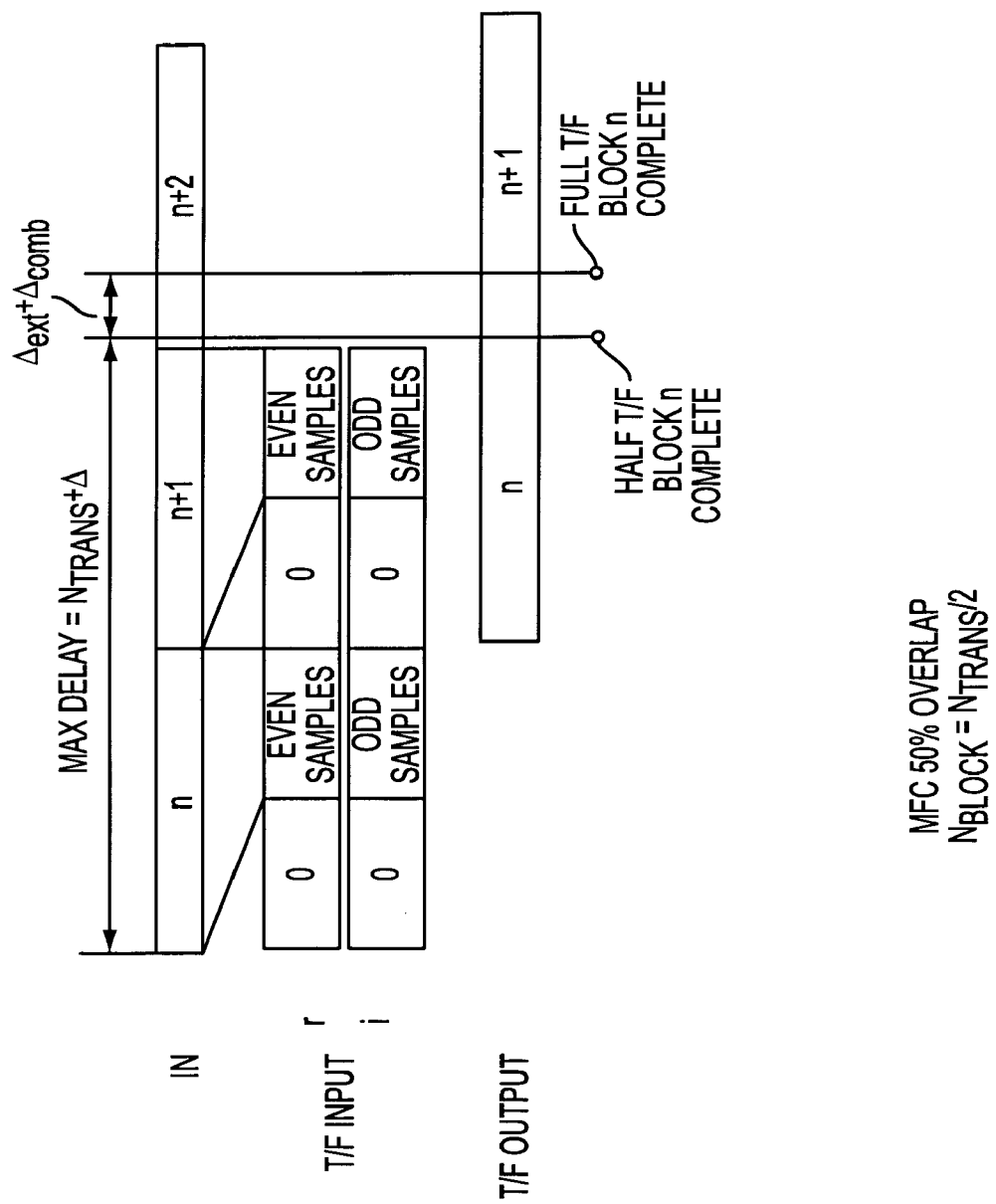

REDUCED DELAY IMPLEMENTATION OF FOURIER TRANSFORM BASED CHANNELIZERS AND DE-CHANNELIZERS

This application claims priority under 35 U.S.C. §§119 and/or 365 to 60/142,909 filed in the United States of America on Jul. 9, 1999; the entire content of which is hereby incorporated by reference.

FIELD OF INVENTION

The present invention relates to the wireless telecommunication. More particularly, the present invention relates to digital channelization and de- channelization in wireless telecommunications systems, including cellular systems, land mobile radio systems, satellite systems and wireless local area networks.

BACKGROUND

In wireless telecommunications systems, such as cellular systems, land mobile radio systems, satellite systems and wireless local area networks, multiple radio channel signals may be received and transmitted simultaneously. The simultaneous reception and transmission of radio channel signals is, in part, accomplished through the use of channelization and de-channelization structures in the radio receiver and transmitter, respectively. In general, the channelization structure, herein referred to as the channelizer, and the de-channelization structure, herein referred to as the de-channelizer, filter, decimate, interpolate and frequency convert the received and transmitted radio signals.

wireless telecommunication systems can also simultaneously recieve and transmit a radio channel on more than one transmission or reception branch. For example, it is typical to use two branch reception on the receive side, which is generally known as diversity. In the future, multi-branch transmission and reception is expected to become more common in both the receive and transmit chains. This technology is often involves smart antennas, adaptive antennas, and/or space-time diversity systems.

While channelizers and de-channelizers are traditionally analog devices, digital channelizers and de-channelizers are now available. Digital channelizers and de-channelizers are generally less complex and less expensive to manufacture. Of course, there are several known ways in which to implement digital channelizers and de-channelizers. However, there are a number of important considerations that should be taken into account in determining which implementation is most advantageous, for example, power consumption, die area and computational complexity.

In a first exemplary implementation, a standalone Modified Fast Convolution (MFC) algorithm may be employed. FIG. 1 illustrates the basic configuration of the MFC algorithm. The MFC algorithm performs all necessary filtering in the frequency domain. Typically, this requires the processing of very large sized data blocks, which results in unacceptably long delays.

In a second exemplary implementation, an improved MFC algorithm, or iMFC, may be employed. FIG. 2 illustrates the basic configuration of the iMFC algorithm. As shown, some of the filtering is accomplished in the frequency domain, while additional channel filtering (ACF) is accomplished in the time domain. By accomplishing part of the filtering in the frequency domain and additional filtering in the time domain, power consumption, die area and computational complexity is improved, as compared to the standalone MFC. Furthermore, the iMFC processes the data in smaller data blocks. This results in smaller processing delays.

Both the standalone MFC and the iMFC algorithms consist of two parts: a common part and a channel part, as illustrated in FIGS. 1 and 2. The common part is common to all channels, and it comprises a data collection portion and a transform portion. The channel part comprises a number of processing paths; one for each channel. For the sake of brevity, both the standalone and the improved MFC algorithms will be referred to herein as the MFC algorithm.

In a third exemplary implementation, a filter bank algorithm may be employed. FIG. 3 illustrates the basic configuration of a filter bank algorithm. As shown, the filter bank algorithm is similar to the MFC algorithms, but for the data collection portion of the filter bank algorithm comprises a common polyphase filter, as indicated, as well as a large Fourier transform. The filter bank algorithm is considered to be a very efficient channelizing/de-channelizing algorithm in terms of power consumption, die area and computational complexity, especially where a large number of channels are involved. This algorithm, however, is less flexible than the MFC algorithms since the channels must lie on a fixed frequency grid and only single channel spacing is possible.

As indicated in FIGS. 1–3, each of the above-mentioned algorithms involve a large transform operation. Radio telecommunications systems usually require that the transform be considerably large (e.g., 1 K in size), and that it operate at a high sampling rate (e.g., 50 MHz). Accordingly, the implementation of the large transform requires special architecture, for example, a "pipeline" Fast Fourier Transform (FFT) architecture, which is well-known in the art. The pipeline FFT algorithm is characterized in that if no input data is available, the pipeline FFT algorithm performs no further computations. This design, among other things, maximizes computational efficiency. However, this characteristic inherently introduces additional processing delays, as processing stops when input data is not present. Although it is possible to flush the pipeline FFT algorithm with "dummy" data, this flushing process results in additional and unnecessary computations. Therefore, the pipeline FFT algorithm is not necessarily optimal.

FIG. 4A illustrates a 4-stage pipeline FFT algorithm, whereas FIG. 4B illustrates the timing and processing delays associated with the processing of a block of data in accordance with the 4-stage pipeline FFT of FIG. 4A. As the type of data that is typically transmitted over a radio telecommunications system, such as voice data, is highly sensitive to delay, it is extremely important to minimize such delay. Since the manner in which the pipeline FFT algorithm processes the data blocks affects the size of the processing delay, various well-known techniques for processing a block of data using a pipeline FFT algorithm have been developed. A number of these known techniques are described herein below.

For the sake of brevity, these known data block processing techniques are described herein below with respect to channelization only, though one skilled in the art will understand that these techniques equally apply to de-channelization. Moreover, in the case of MFC algorithms, an overlap and add technique, which is also well-known in the art, is assumed.

A first of these techniques involves processing one block of data through one large real transform. The total processing delay (i.e., $Delay_{process}$) is defined by the following equation:

$$Delay_{process} = (Delay_{collect} + Delay_{trans}) \text{ sample periods} \quad (1)$$

where $Delay_{collect}$ represents the delay associated with collecting the data, while $Delay_{trans}$, represents the delay associated with implementing the transform. Accordingly, $Delay_{trans}$, is often referred to as the implementation delay.

For MFC based algorithms, $Delay_{collect}$ may be defined in accordance with the following relationship:

$$Delay_{collect} = [(1-\eta)^* N_{trans}] \text{sample periods} \quad (2)$$

where $\eta$ is the overlap percentage (e.g., 50 percent or 25 percent). For filter bank algorithms, $Delay_{collect}$ is simply defined by the size of the FFT transform, as shown in equation (3) below:

$$Delay_{collect} = N_{trans} \text{ sample periods} \quad (3)$$

It is important to note that the implementation delay, $Delay_{trans}$, is based on the period of time from when the first sample of the first data block to be processed enters the FFT algorithm, until the last sample of the last data block to be processed is generated by the FFT algorithm. For a pipeline FFT algorithm, the implementation delay is given in accordance with the following equation:

$$Delay_{trans} = [N_{trans} + \Delta] \text{ sample periods} \quad (4)$$

where $\Delta$ is an additional minimal delay associated with clearing the last one or more results from the current FFT transform, as explained above.

Based on equations (1), (2), (3) and (4) above, the total processing delay associated with an MFC based algorithm is as follows.

$$Delay_{process} = [(2-\eta)^* N_{trans} + \Delta] \text{ sample periods} \quad (5)$$

The total processing delay associated with a filter bank based algorithm is, in contrast, given as follows.

$$Delay_{process} = [2^* N_{trans} + \Delta] \text{ sample periods} \quad (6)$$

Table I below summarizes the processing delays associated with the first prior art data block processing technique, if a MFC algorithm with 50 percent overlap is employed, a MFC algorithm with 25 percent overlap is employed, or an over-sampled filter bank algorithm is employed. It should be noted that because of the overlapping employed by the MFC based algorithms, and the over sampling that is employed by filter bank algorithms, more than one large transform is needed. In the case of a MFC based algorithms with 50 percent overlapping, the $Delay_{process}$ is approximately $1.5^* N_{trans}$. In the case of a MFC based algorithm with 25 percent overlapping, the $Delay_{process}$ is approximately $1.75^* N_{trans}$. For the filter bank algorithm, the $Delay_{process}$ is approximately $2^* N_{trans}$. These values, however, assume that the large transform is clocked at the input sampling rate. The large transform could, alternatively, be clocked at a higher sampling rate to overcome this problem. Either way, both alternatives require excessively large computational overhead.

TABLE I

| ALGORITHM | DELAYprocess |
|---|---|
| MFC with 50% overlap | 1.5 * Ntrans + $\Delta$ ≈ 1.5Ntrans |
| MFC with 25% overlap | 1.75 * Ntrans + $\Delta$ ≈ 1.75Ntrans |
| Filter Bank | 2 * Ntrans + $\Delta$ ≈ 2Ntrans |

FIG. 5A illustrates a second known technique, wherein two data blocks, each of length $N_{trans}$, containing real data are multiplexed into one large complex transform. This second technique is based on the fact that in radio communications systems, all the data to be processed is real data. More specifically, FIGS. 5B–D show that consecutive data blocks, for example, data blocks n and n+1 are multiplexed into the pipeline transform simultaneously as a single, complex block real(n)+j(imag(n+1)). The resulting transform is given as follows:

$$Z(k) = A(k) + jB(k) \quad (7)$$

where k is an integer value between "0" and $[N_{trans}-1]$.

FIGS. 5B–D also illustrate the maximum delay due to processing associated with this second alternative technique. As shown in FIG. 5B, for example, maximum $Delay_{process}$ for a MFC based algorithm employing 50 percent overlap, where each data block n, n+1, n+2, n+3 has a length of $N_{trans}/2$, is $[2^* N_{trans} + \Delta]$. In FIG. 5C, the maximum $Delay_{process}$ for a MFC based algorithm employing 25 percent overlap, where each data block n, n+1, n+2, n+3has a length of 3N trans/4, is $[3^* N_{trans} + \Delta]$. It will be understood by one skilled in the art that zeros may be used to flush the FFT algorithm in order to generate the last transform associated with the second data block without incurring yet additional processing (i.e., implementation) delays. Finally, in FIG. 5D, the maximum $Delay_{process}$ for a filter bank algorithm, where each data block n, n+1, n+2, n+3 has a length of $N_{trans}$ is $[4^* N_{trans} + \Delta]$. Table II below summarizes these $Delay_{process}$ values.

TABLE II

| ALGORITHM | DELAYprocess |
|---|---|
| MFC with 50% overlap | 2 * Ntrans + $\Delta$ ≈ 2Ntrans |
| MFC with 25% overlap | 3 * Ntrans + $\Delta$ ≈ 3Ntrans |
| Filter Bank | 4 * Ntrans + $\Delta$ ≈ 4Ntrans |

As indicated in Table II, the maximum processing delays associated with the second alternative technique are greater than the maximum processing delays associated with the first alternative technique, which are indicated in Table I. However, the effect of multiplexing two consecutive data blocks through one complex transform amounts to fewer computations on a per block basis.

It should be noted that additional memory, as well as adders, may be needed for pre-processing and post-processing purposes. As for pre-processing, a memory of size $(1-\eta)^* N_{trans}$ for the MFC algorithms and a memory of size $N_{trans}$ for critically sampled, filter bank based algorithms would be required. Post-processing, as illustrated in FIG. 5A, involves select and extract algorithms, which are based on the unique symmetry of the real and imaginary input signal respectively, as found in the transform output. More particularly, the select algorithm selectively collects the output transforms from the pipeline transform algorithm associated with active frequency channels. For any given channel, the output transform may be defined in accordance with equation (7), where k represents the bin number (i.e., the sample frequency), and where k may vary between 0 and $[N_{trans}-]$. For a specific channel, however, k may range from $k_{start}$ to $[k_{start+(N-1)}]$, where $k_{start}$ represents a starting bin, $[k_{start+(N-1)}]$ represents the last bin, where N represents the number of bins which define the channel, and where N is generally much less than $N_{trans}$. For a filter bank algorithm, N would simply be equal to 1.

The extraction algorithm generates, for further processing, the transform results REAL(k) and IMAG(k) as given by the following equations:

$$REAL(k) = \{A(k) + A(N_{trans} - k)\}/2 + j\{B(k) - B(N_{trans} - k)\}/2 \quad (8)$$

$$IMAG(k) = \{B(k) + B(N_{trans} - k)\}/2 + j\{A(k) - A(N_{trans} - k)\}/2 \quad (9)$$

where REAL(k) and IMAG(k) are the transforms associated with the first data block, real(n), the second data block, imag(n+1), respectively.

A third technique involves a well-known decimation-in-time (DIT) procedure applied to a Fast Convolutional algorithm. This third technique first divides a data block of length $N_{trans}$ into blocks of even and odd samples. The even and odd samples are then multiplexed into real and imaginary parts respectively, where the new input data block is $N_{trans}/2$ in length. A large transform of size $N_{trans}/2$ is then performed on the new data block, after which the results are combined to form a transform of length $N_{trans}$. This technique optimizes the number of multiplications per point for the application of the Fast Convolution algorithm only. This algorithm, however, requires two large transforms, it does not provide for frequency translation or decimation/interpolation, and it is, therefore, quite different from the MFC and filter bank algorithms.

Yet another known technique may involve the use of more horsepower (i.e., parallel processing hardware), as a means for reducing the delay associated with different computation parts. However, such a solution tends to be very costly in terms of power consumption, die area and computational complexity. Therefore, it is generally an undesirable alternative.

Given the various data block processing techniques described above, one skilled in the art will readily appreciate that these techniques have focused more on reducing the computational complexity, without much consideration to the latency introduced by large transform algorithms. Thus, one skilled in the art will also appreciate the fact that a need exists to formulate other alternative techniques which focus more on minimizing the implementation delays (i.e., Delay$_{trans}$) and/or processing delays (i.e., Delay$_{process}$) associated with large transforms. And, moreover, to do so without increasing power consumption, die area and computational complexity.

SUMMARY

The present invention, as stated previously, relates to digital channelization and de-channelization in wireless telecommunications systems. More specifically, the present invention involves a technique, and several variations thereof, for processing data blocks in conjunction with the transformation of these data blocks by a large, Fast Fourier Transform (FFT) algorithm, such as a Modified Fast Convolution (MFC) algorithm or a filter bank algorithm. The present invention takes advantage of multiple transmission and reception branches, and unlike prior techniques, focuses on minimizing implementation delays associated with the large transform algorithm, without significantly affecting other critical channelizer/de-channelizer design characteristics, such as, power consumption, die area and computational complexity.

Accordingly, it can be stated that a primary objective of the present invention is to reduce the processing delays associated with the channelizers and de-channelizers in wireless telecommunications systems, particularly where the telecommunications data involved is highly sensitive to such delays.

It is another objective of the present invention to minimize the implementation delays associated with the transformation of data blocks from the time domain to the frequency domain in wireless telecommunication system channelizers and de-channelizers.

It is still another objective of the present invention to minimize the above-identified implementation delays, which results in a reduction of processing delays, without significantly affecting other critical parameters such as power consumption, die area, and computational complexity.

BRIEF DESCRIPTION OF THE FIGURES

The objectives and advantages of the present invention will be understood by reading the following detailed description in conjunction with the drawings, in which:

FIGS. 6A–E illustrate a first exemplary embodiment of the present invention, which involves the use of one complex transform and two diversity branches;

DETAILED DESCRIPTION OF THE INVENTION

Figure 1:
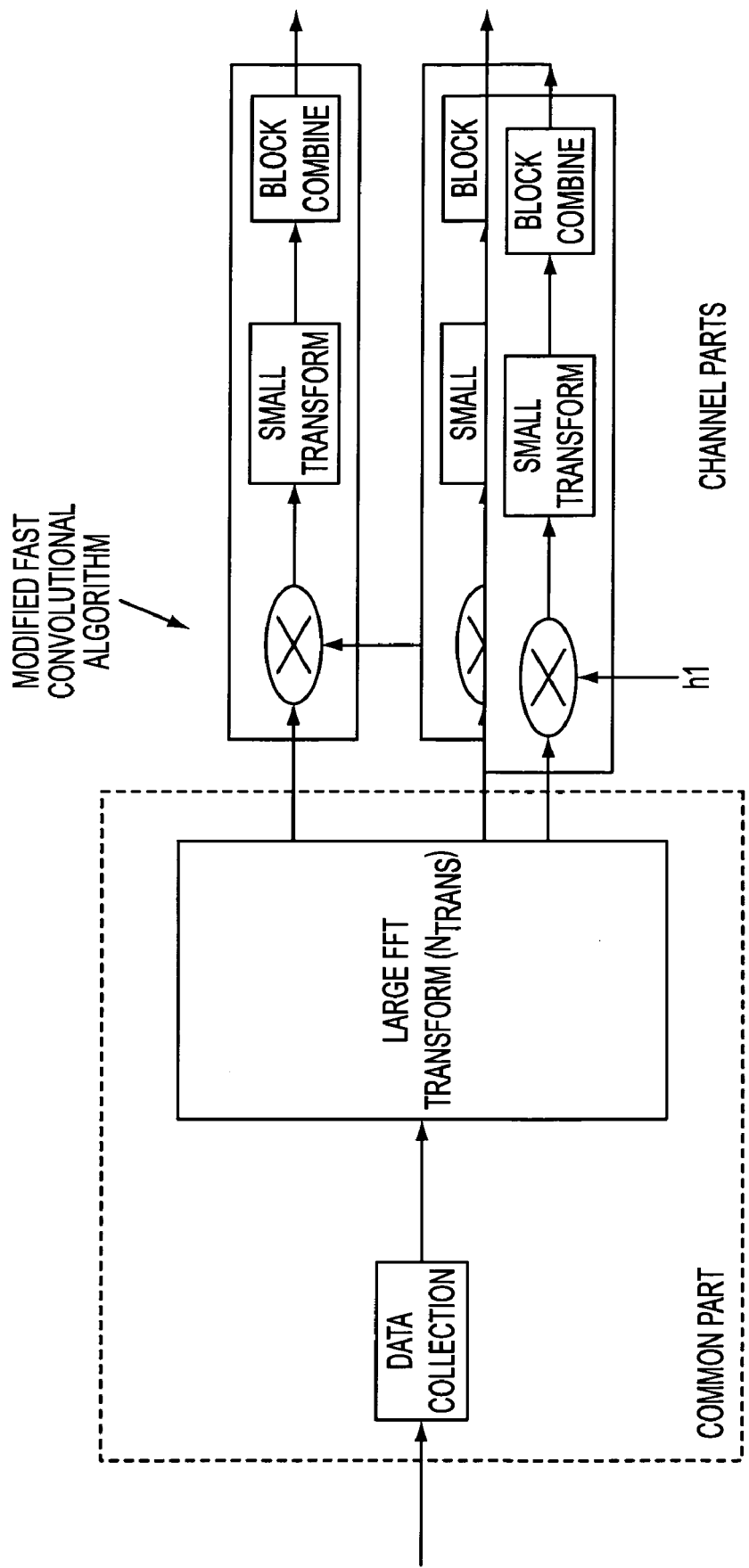
FIG. 1 illustrates a prior art MFC algorithm.
Figure 2:
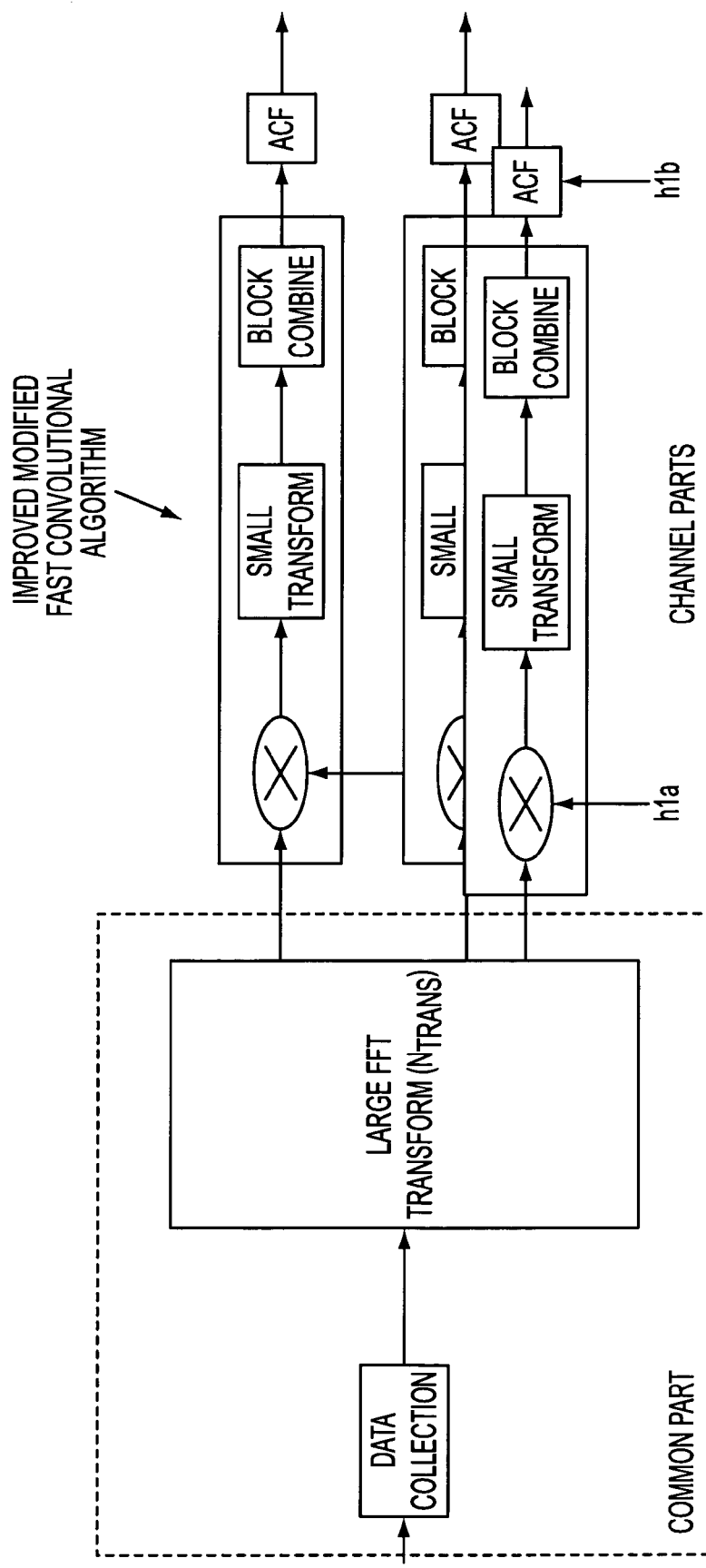
FIG. 2 illustrates a prior art iMFC algorithm.
Figure 3:
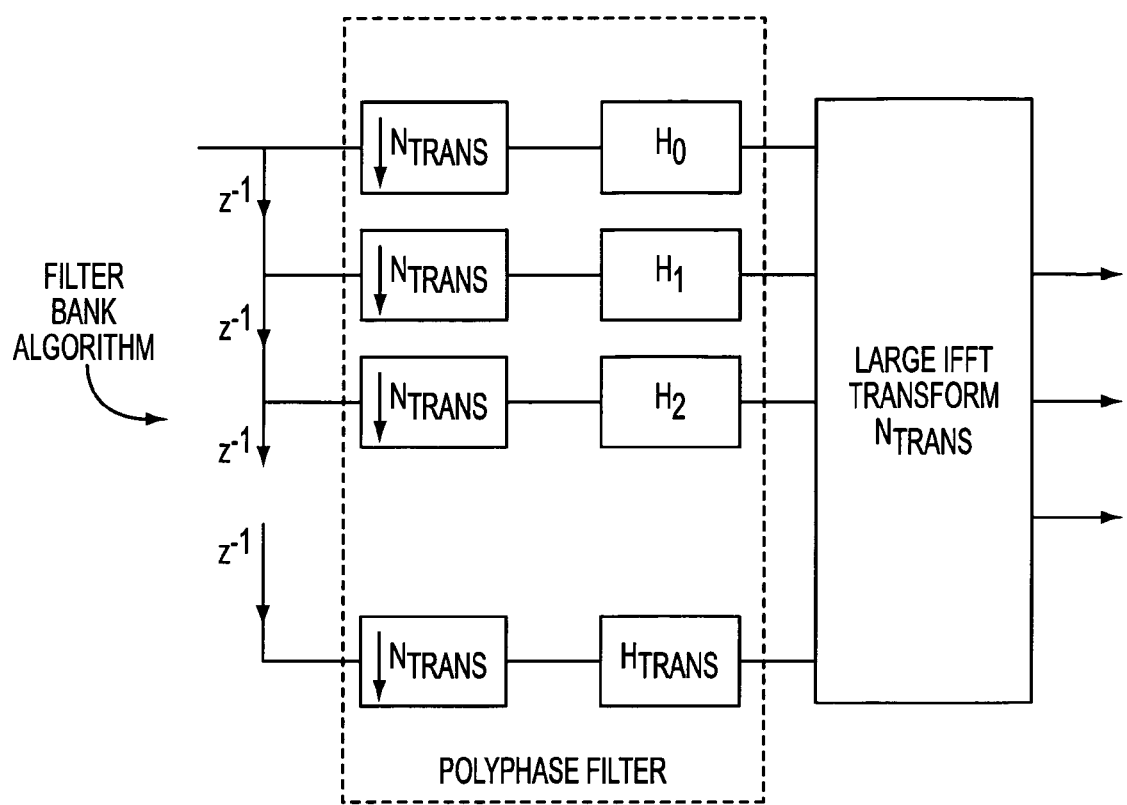
FIG. 3 illustrates a prior art filter bank algorithm.
Figure 4A:
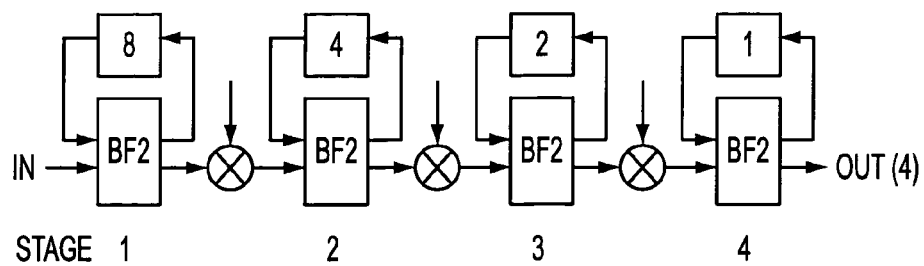
FIGS. 4A–B illustrate a prior art 4-stage pipeline FFT algorithm.
Figure 4B:
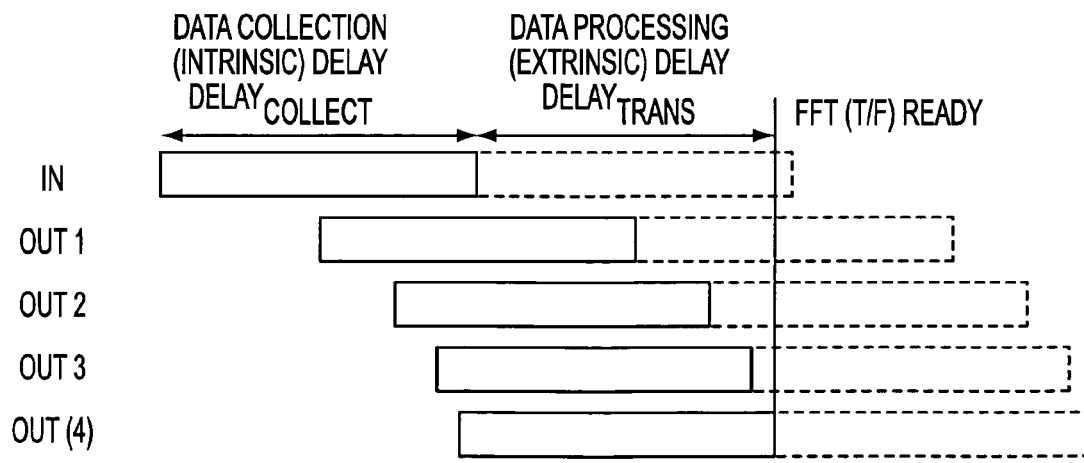
Figure 5A:
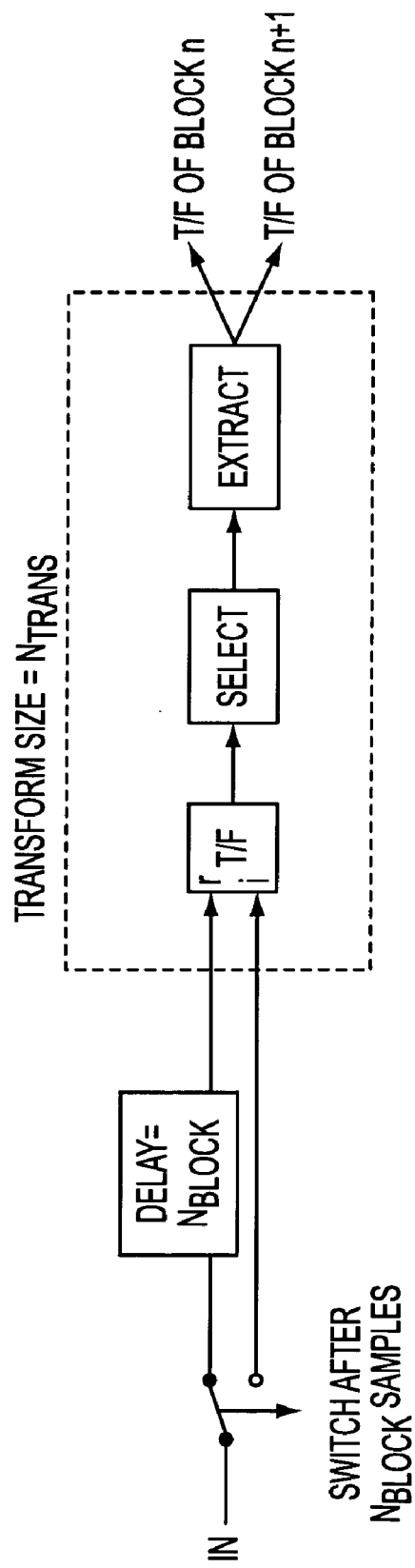
FIGS. 5A–D illustrate a prior art technique wherein two data blocks, each containing real data, are multiplexed into one large complex transform.
Figure 5B:
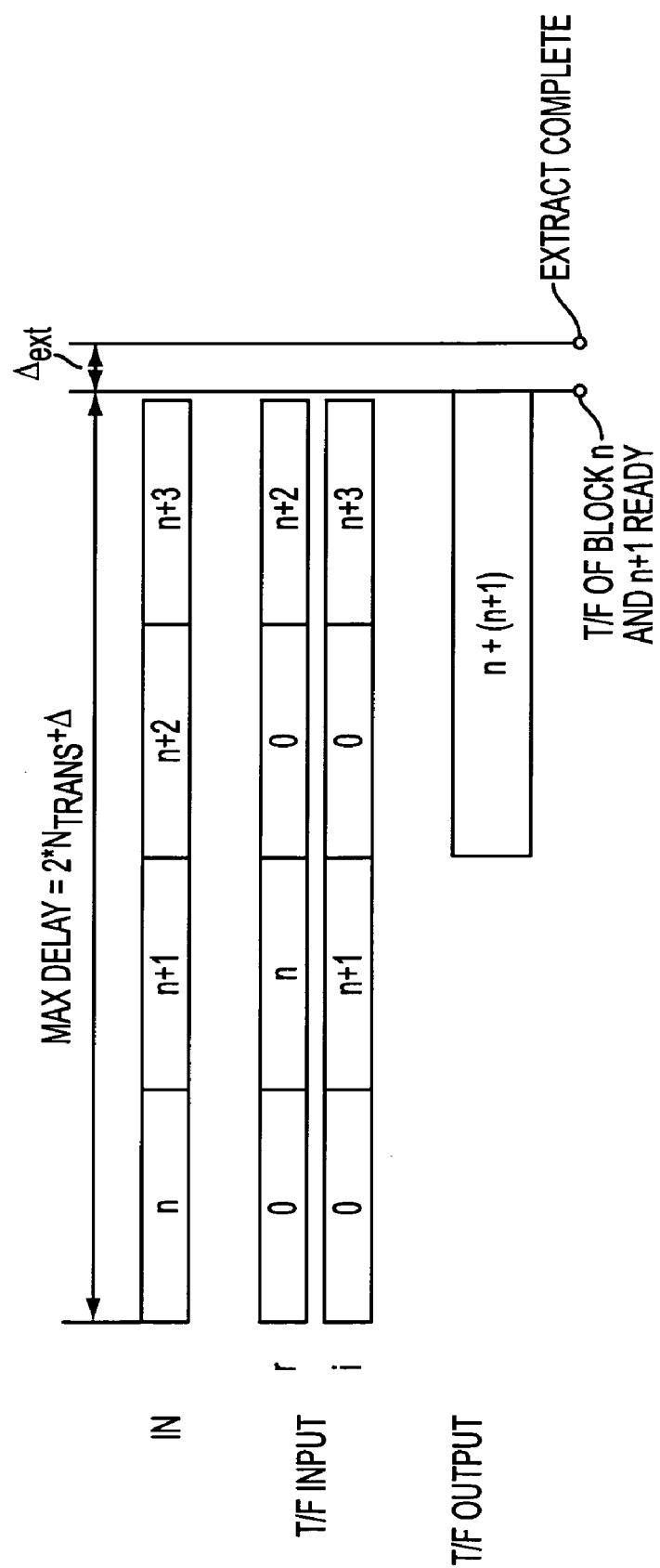
Figure 5C:
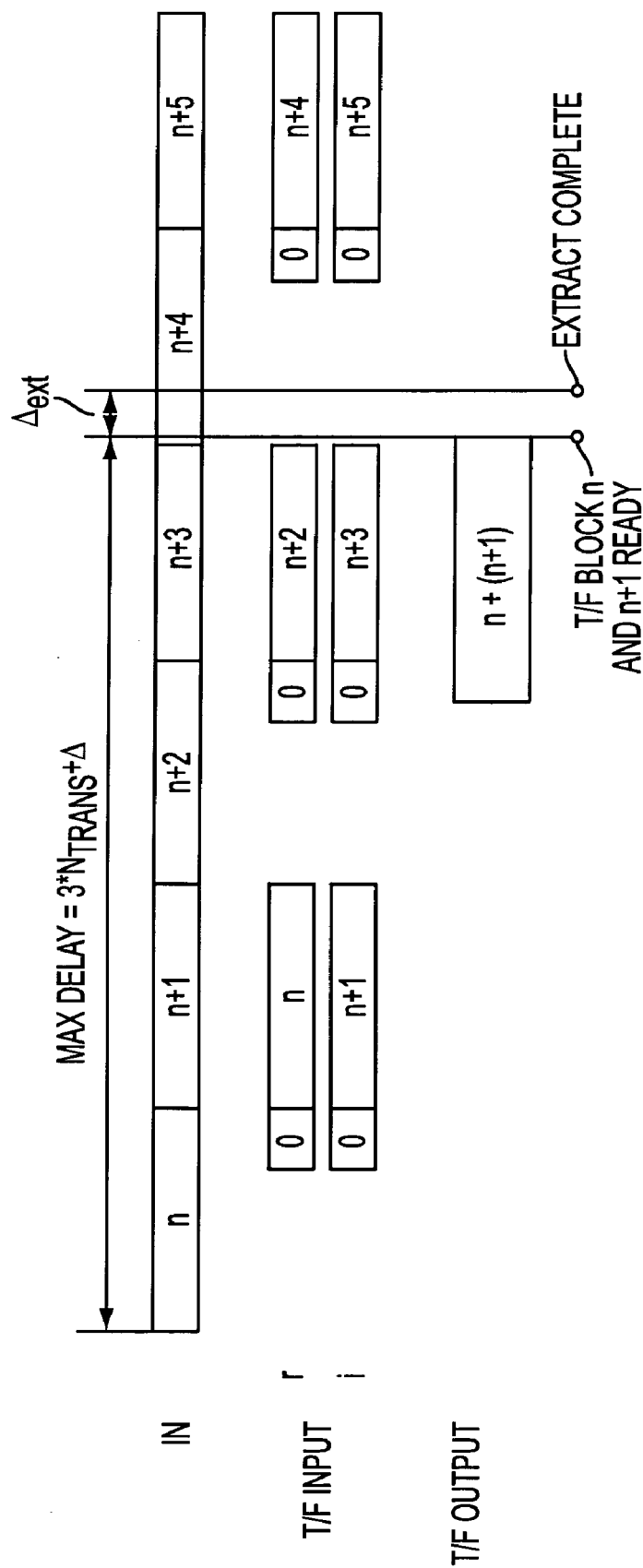
Figure 5D:
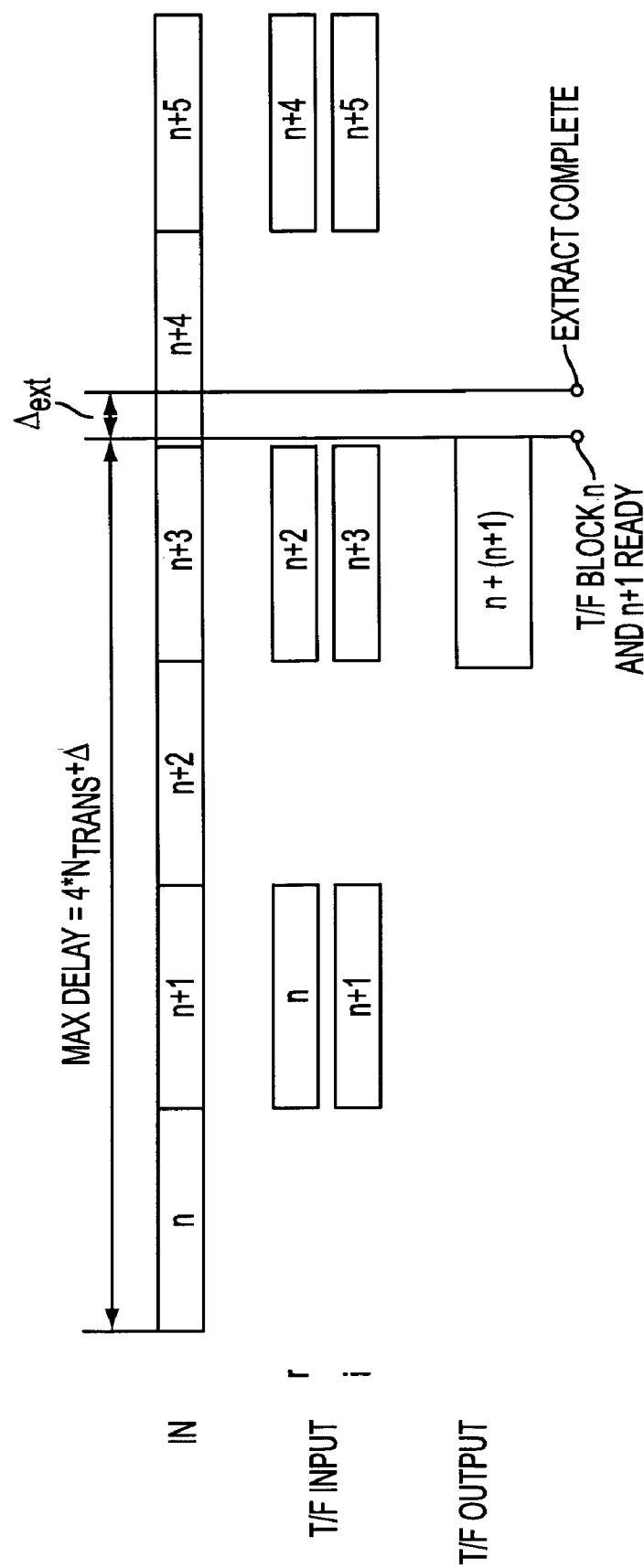

The present invention provides a technique, and variations thereof, for reducing the delay associated with certain channelizer and/or de-channelizer algorithms in a wireless telecommunications system. While prior techniques have focused on improving the computational complexity of these algorithms, which include MFC based algorithms as well as filter bank algorithms, they have done so at the expense of the latency that is introduced by the large transforms that are integral to the channelizer and/or de-channelizer algorithms. The present invention, however, focuses on improving the latency, and in particular, the implementation delays associated with these algorithms, without significantly affecting other critical algorithm characteristics such as power consumption, the die area, and computational complexity.

For the purpose of brevity, the present invention will be described primarily in terms of a channelizer algorithm (i.e., in the receiver). However, one skilled in the art will appreciate the fact that the following description of the present invention equally applies to de-channelizer algorithms (i.e., in the transmitter). In addition, a number of assumptions are made in describing the present invention. First, in describing the present invention as it applies to MFC based algorithms, it is assumed that the MFC algorithms employ overlap and add techniques. Second, it is assumed that the large transform employed by the channelizer and/or de-channelizer has a radix-2 configuration. Third, in order to provide some objective comparison between the present invention and prior techniques, the second prior technique described above and illustrated in FIGS. 5A–D is used as, and referred to herein as a reference technique.

To objectively measure the effectiveness of each exemplary embodiment of the present invention, three parameters, other than processing delay (i.e., Delay$_{process}$) are evaluated. The three parameters are arithmetic complexity, arithmetic effort and memory. Arithmetic complexity, which provides an indication of die area, is measured by the number of complex multipliers, and it relates to the size of the transform as follows.

$$\text{Complexity} = \log_2 N_{trans} \text{ Complex multipliers} \quad (10)$$

The average arithmetic effort, which provides an indication of power consumption, will be defined as follows:

$$\text{Effort} = (\text{Complexity} * \text{Duty Cycle})/\text{No. of Diversity Branches} \quad (11)$$

where the duty cycle is defined by the following relationship.

$$\text{Duty Cycle} = \text{Period of Activity}/\text{Full Cycle of Pipeline Transform} \quad (12)$$

For reference purposes, Table 3 presents values for the arithmetic complexity and arithmetic effort associated with the second prior technique described above, which involved multiplexing two consecutive data blocks containing real data through a complex transform algorithm.

TABLE III

| ALGORITHM | COMPLEXITY | DUTY CYCLE | EFFORT |
| --- | --- | --- | --- |
| MFC with 50% overlap | $\log_2 N_{trans}$ | 1 | $1 * \log_2 N_{trans}$ |
| MFC with 25% overlap | $\log_2 N_{trans}$ | 36220 | $\frac{2}{3} * \log_2 N_{trans}$ |
| Filter Bank | $\log_2 N_{trans}$ | 36191 | $\frac{1}{2} * \log_2 N_{trans}$ |

The third parameter, memory, can be divided into collection memory (i.e., the memory required to support data collect) and transform memory (i.e., the memory required to support the large transform algorithm). Memory is an important consideration because it directly affects both die area and power consumption. Table IV below presents the memory considerations associated with the prior, two data block, one large complex transform technique.

TABLE IV

| ALGORITHM | COLLECTION MEMORY | TRANSFORM MEMORY | TOTAL MEMORY |
| --- | --- | --- | --- |
| MFC with 50% overlap | $N_{trans}/2$ | $2 * N_{trans}$ | $2\frac{1}{2} * 2N_{trans}$ |
| MFC with 25% overlap | $3N_{trans}/4$ | $2 * N_{trans}$ | $2\frac{3}{4} * N_{trans}$ |
| Filter Bank | $N_{trans}$ | $2 * N_{trans}$ | $3 * N_{trans}$ |

A first exemplary embodiment of the present invention involves the use of one complex transform and two diversity branches. Radio telecommunications systems may employ two or more diversity branches, as one skilled in the art will readily appreciate. Current systems typically employ two diversity branches on the receive side. However, in the near future, it is expected that multi-branch diversity will be common-place for both the receive and transmit chains. Antennas that support multi-branch diversity are often referred to as "smart antennas" and/or "adaptive antennas".

This first exemplary embodiment of the present invention is based upon a more efficient utilization of available resources, namely, the two diversity branches employed by a typical radio telecommunications receiver. In essence, two diversity branches can supply more data to the channelizer algorithm, and in particular, the pipeline algorithm incorporated therein, than a single data branch. This, in turn, increases the period of activity of the pipeline transform. Of course, increasing the period of activity of the pipeline transform causes the duty cycle of the pipeline transform to increase, as shown by equation (12) above. Increasing the duty cycle of the pipeline transform results in a reduction of the implementation delay (i.e., Delay$_{trans}$) associated with the pipeline transform, and therefore, a reduction in the overall processing delay (i.e., Delay$_{process}$).

Figure 6A:
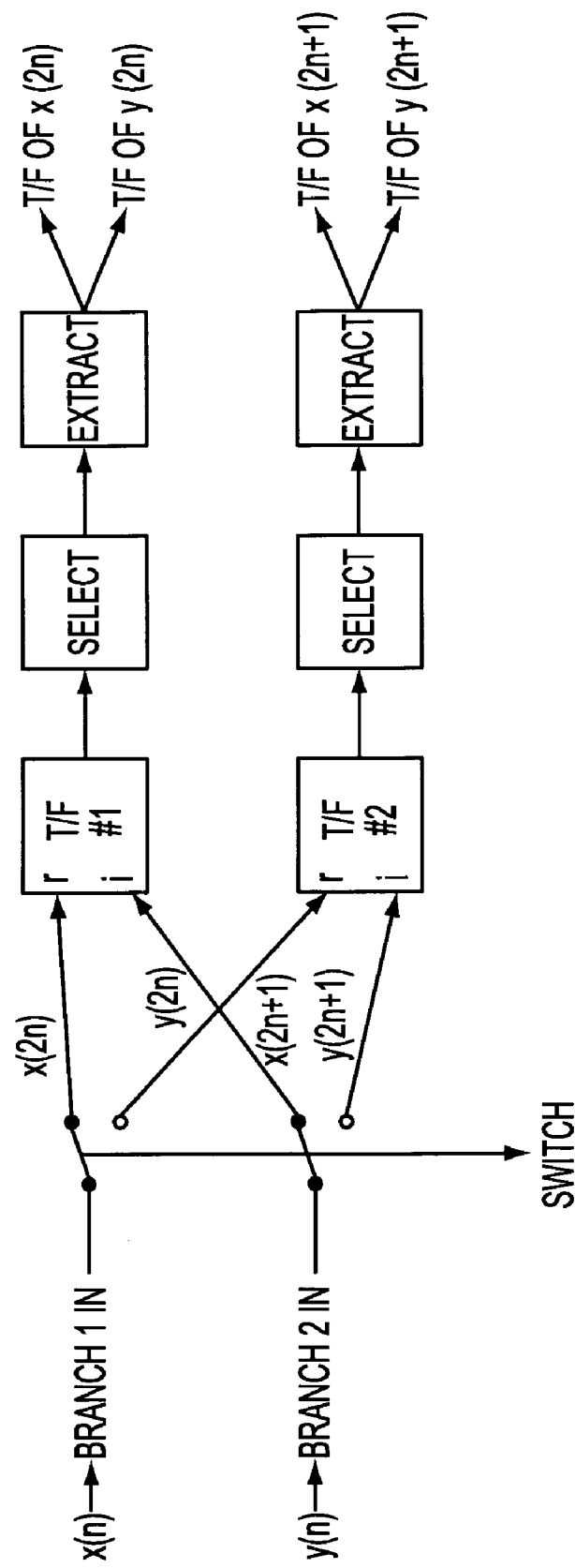

FIG. 6A illustrates the technique associated with this first exemplary embodiment of the present invention. As shown, the pipeline transform T/F associated with each of the two diversity branches need not wait for or process each data block, as does the reference technique described above. Instead, each processes alternative data blocks. For instance, the pipeline transform T/F$_1$ might process and transform only the even data blocks associated with the two streams of data blocks x(n) and y(n), wherein the even data blocks are represented by x(2n) and y(2n) in FIG. 6A. Pipeline transform T/F$_2$ would, therefore, process and transform only the odd data blocks, represented in FIG. 6A as x(2n+1) and y(2n+1).

Figure 6B:
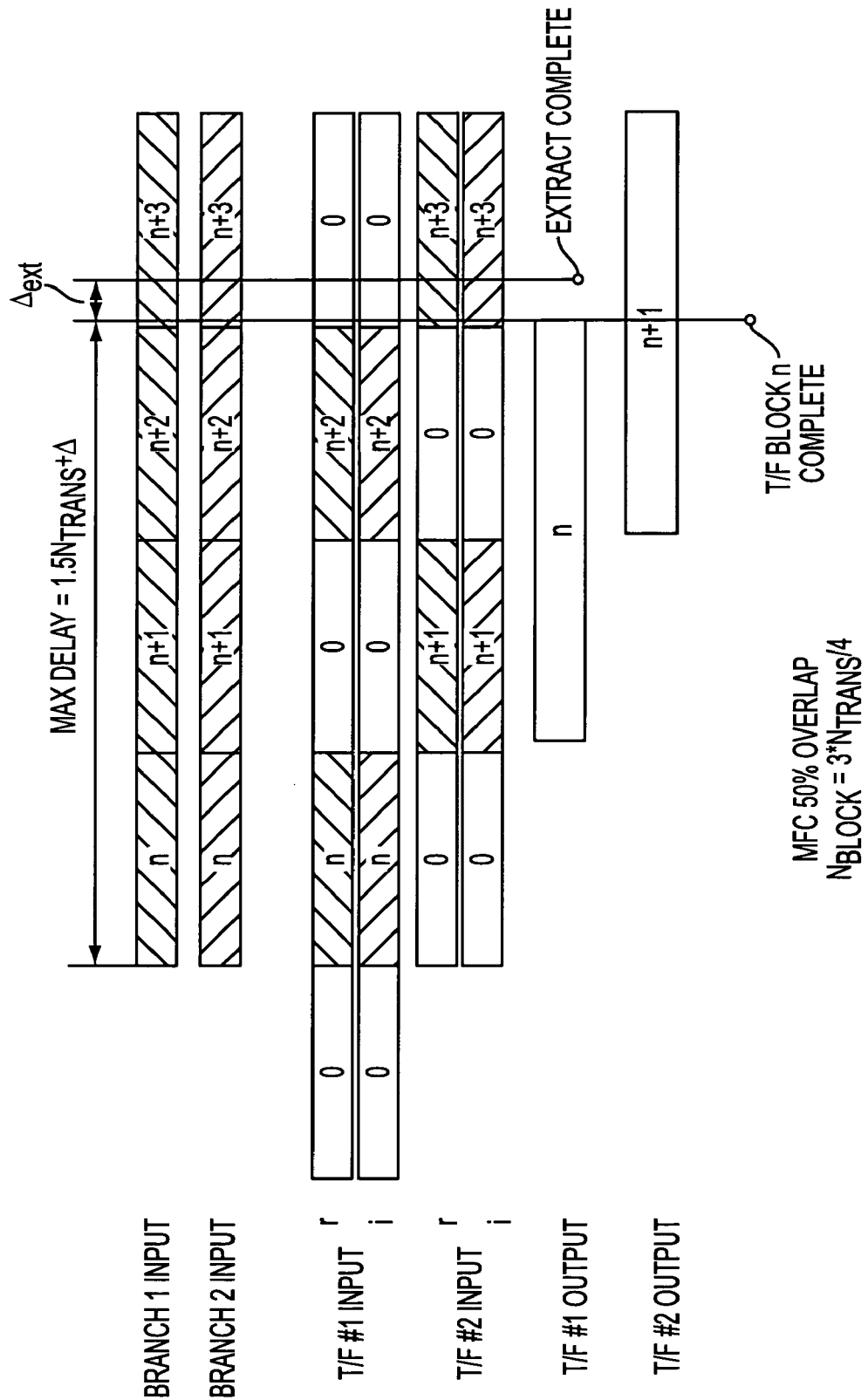
Figure 6C:
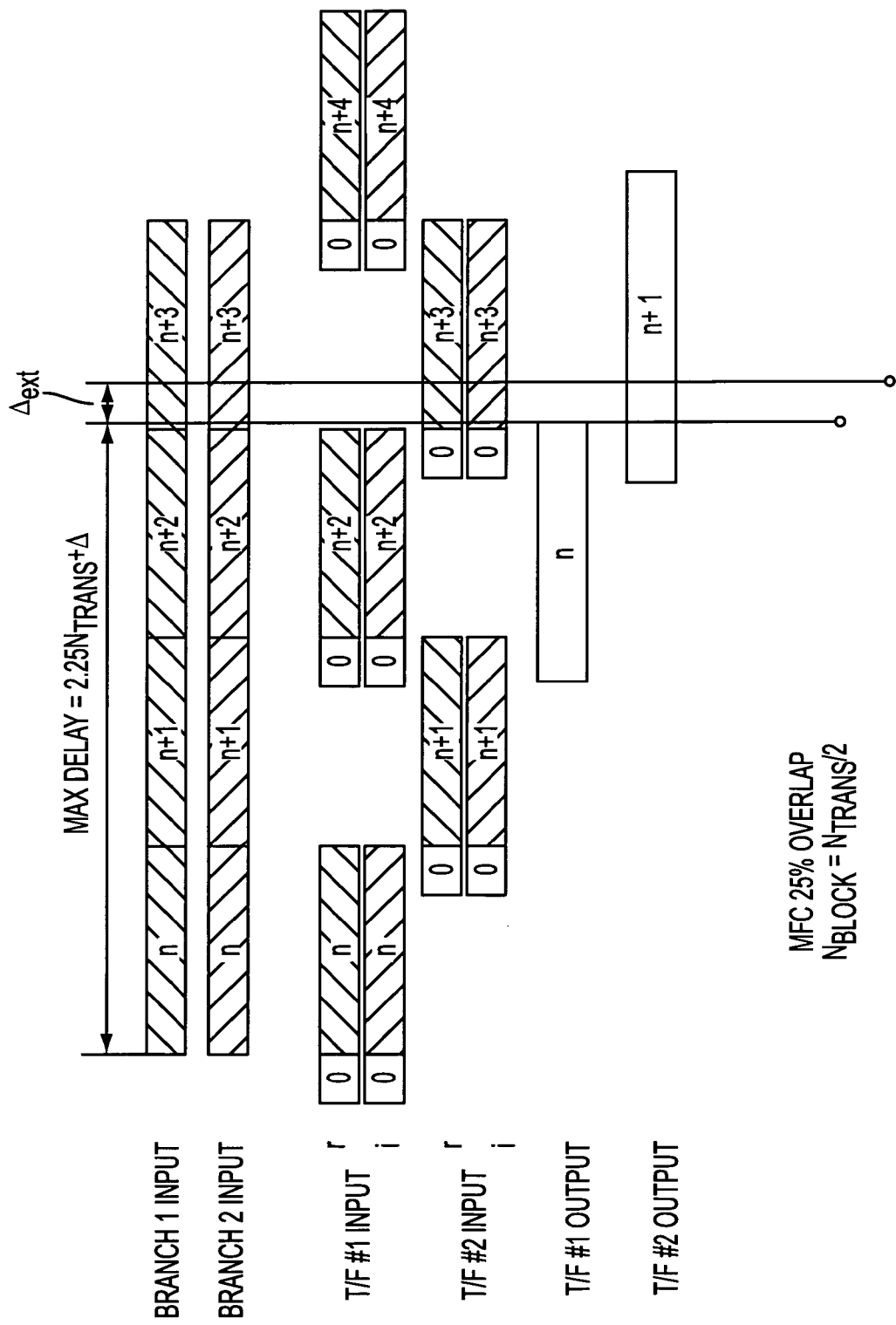

FIGS. 6B–D illustrate the timing and processing delays associated with the first exemplary embodiment of the present invention as it applies to a MFC based algorithm with 50 percent overlap, a MFC based algorithm with 25 percent overlap, and a filter bank algorithm respectively. More specifically, each of FIGS. 6B–D shows the two data block streams x(n) and y(n), each of which comprise data blocks n, n+1, n+2, n+3 . . . , being multiplexed in such a manner that the even data blocks x(2n) and y(2n) are directed to the real (r) and imaginary (i) inputs of the first pipeline transform T/F, respectively. Similarly, the odd data blocks x(2n+1) and y(2n+1) are directed to the real (r) and imaginary (i) inputs of the second pipeline transform T/F$_2$. The maximum processing delay, in accordance with this first exemplary embodiment, that is, the amount of time required to input the first sample of a given data block (e.g., data block "n") into the pipeline transform, until the time the pipeline transform outputs the transform associated with the last sample of that data block is illustrated in each of FIGS. 6B–D. The processing delay (i.e., Delay$_{process}$) is also summarized in Table V below.

TABLE V

| ALGORITHM | DELAY$_{process}$ |
|---|---|
| MFC with 50% overlap | 1.5 * N$_{trans}$ + Δ + Δ$_{ext}$ ≈ 1.5N$_{trans}$ |
| MFC with 25% overlap | 2.25 * N$_{trans}$ + Δ + Δ$_{ext}$ ≈ 2.25N$_{trans}$ |
| Filter Bank | 2 * N$_{trans}$ + Δ + Δ$_{ext}$ ≈ 2N$_{trans}$ |

It should be noted that the select and extract algorithms are identical to those in the reference technique described above. Given that each active channel to be extracted only consists of a small number of frequency bins, the delay associated with the selection and extraction process is negligible as indicated in the results presented in Table V. Accordingly, the processing delay associated with this first exemplary embodiment of the present invention, as shown in Table II, represents approximately a 20–50 percent reduction in implementation delay over the reference technique, which is summarized in Table V above.

Table VI summarizes the arithmetic complexity and arithmetic effort associated with this first exemplary embodiment. From the results presented in Table VI, it can be seen that the arithmetic complexity actually increased by a factor of 2 over the reference technique, which is summarized in Table III above, except in the case of the filter bank algorithm, which makes use of the two diversity branches so as to keep the pipeline full, as indicated in FIG. 6D. The increase in arithmetic complexity is attributable to diversity. However, the arithmetic effort per diversity branch is unchanged in the case of the MFC algorithm. It is halved in the case of the filter bank algorithm.

TABLE VI

| ALGORITHM | COMPLEXITY | DUTY CYCLE | EFFORT |
|---|---|---|---|
| MFC with 50% overlap | 2 * log$_2$N$_{trans}$ | 1 | 1 * log$_2$N$_{trans}$ |
| MFC with 25% overlap | 2 * log$_2$N$_{trans}$ | 36220 | ⅔ * log$_2$N$_{trans}$ |
| Filter Bank | log$_2$N$_{trans}$ | 36191 | ½ * log$_2$N$_{trans}$ |

As for the memory requirements associated with the first exemplary embodiment of the present invention, which are summarized in Table VII below, overall memory requirements are less than that of the reference technique. In fact, there are no memory requirements for data collection. When the reduction in the required memory is taken into account along with the arithmetic complexity and effort, overall die area and power consumption for the first exemplary embodiment are less than that of the reference technique.

TABLE VII

| ALGORITHM | COLLECTION MEMORY | TRANSFORM MEMORY | TOTAL MEMORY |
|---|---|---|---|
| MFC with 50% overlap | 0 | 2 * N$_{trans}$ | 2 * N$_{trans}$ |
| MFC with 25% overlap | 0 | 2 * N$_{trans}$ | 2 * N$_{trans}$ |
| Filter Bank | 0 | 2 * N$_{trans}$ | 2 * N$_{trans}$ |

Figure 6E:
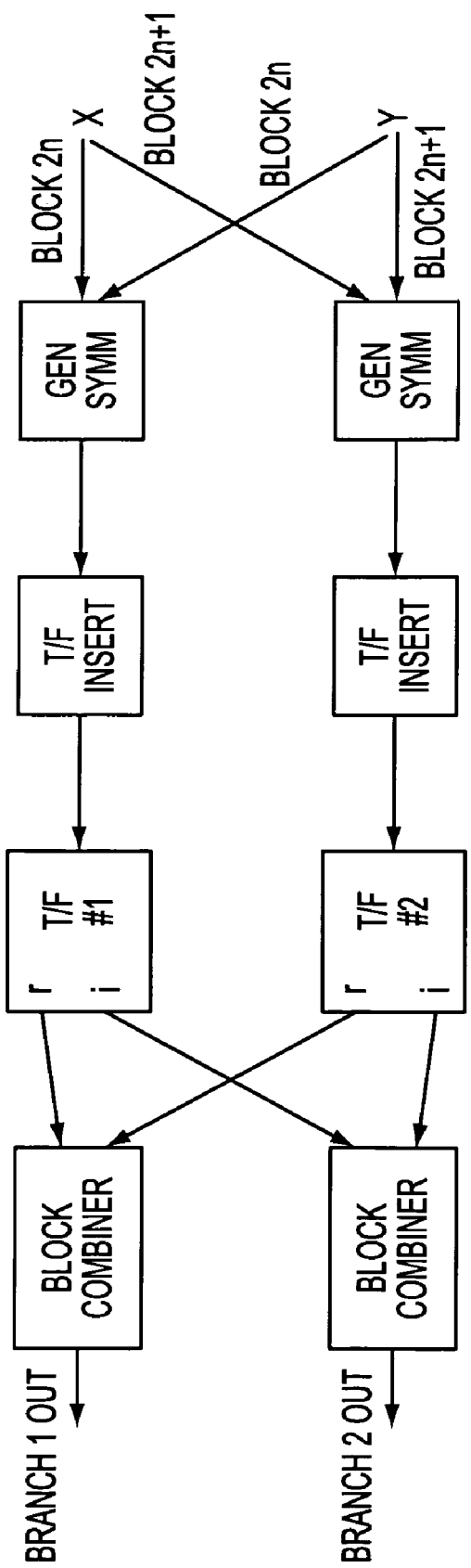

Similar results may be achieved for a de-channelizer. FIG. 6E illustrates the implementation of the de-channelizer algorithm in accordance with the first exemplary embodiment of the present invention, wherein the first step involves generating a symmetrical data vector, such that one diversity branch eventually appears only on the real transform output, while the other diversity branch (e.g., the second diversity branch) appears only on the imaginary transform output. This condition can occur if the bins are inserted in a symmetrical way. The reason for doing this is that the final block combining process becomes a simple multiplexing operation. The symmetrical generation equations for the even numbered data blocks are defined by the following two equations:

$$Z_{2n}(k_{start}+k)=[X_{2n}(k)+jY_{2n}(k)]/2 \qquad (13)$$

$$Z_{2n}(N_{trans}-k_{start}-k)=[X'_{2n}(k)+jY'_{2n}(k)]/2 \qquad (14)$$

where X and Y each represent a stream of data blocks associated with the same physical channel, each is received over one of the two diversity branches, and where the subscript "2n" denotes even data blocks. Both X2n'(k) and Y2n'(k) are the complex conjugates of X2n(k) and Y2n(k) respectively, and where k is defined as zero (0) to N−1. Note that N is, typically, significantly smaller than the size of the transform size N$_{trans}$. The transform vector for even blocks in which they are inserted is defined as Z2n(h), where h may have a value between 0 and Ntrans−1. The variable kstart defines where the first bin of the channel is to be inserted and can be an integer number anywhere between 1 and Ntrans−1. Also note that the same equations apply for transform relating to the odd data blocks X(2n+1) and Y(2n+1). Additionally, more than one channel may be entered into the transform vector, which in the case of overlapping locations, the overlapping locations should be simply added to form the final transform vector location.

The data vector generated is then handled by the transform insert process, which simply inputs the transform vector into the pipeline transform in a bit reversed order, such that the pipeline transform result is in correct order.

The real data from both the first and the second transforms is directed to the first diversity branch block combiner, while imaginary data from both the first and the second transform is directed to the second diversity branch block combiner. The block combiner for the filter bank based algorithms simply pipes the data through the polyphase filter implementation, which is considered here to be a unity operation. For the MFC based algorithms the block combiner overlaps the consecutive blocks by a length of ηN$_{Trans}$. In the overlap and add version the overlapping part is added to the previous blocks corresponding overlapping section, while for overlap and save version the overlapping section of the block is simply discarded. For overlap and save, there are no operation performed on the non-overlapped section.

In summary, the first exemplary embodiment of the present invention provides a reduction in processing delay, as indicated in Table V above. It also provides a reduction in power consumption and die area over the reference technique. For the filter bank algorithm, the first exemplary embodiment also offers a reduction in arithmetic complexity.

A second exemplary embodiment of the present invention involves the processing of one data block containing real data through a half-size, complex transform. A full-sized transform is generated by extracting and then combining only those points needed for further processing.

In general, this second exemplary embodiment of the present invention is based on the fact that a large, radix-2 point transform may be decomposed into two N$_{trans}$/2 point transforms, followed by a combining process to achieve a N$_{trans}$ point transform. More specifically, the one data block is divided into even and odd samples. A $N_{trans}/2$ transform is performed on both the sequence of even samples and the sequence of odd samples. The results are then selected, extracted and combined to form a $N_{trans}$ point transform.

Figure 7A:
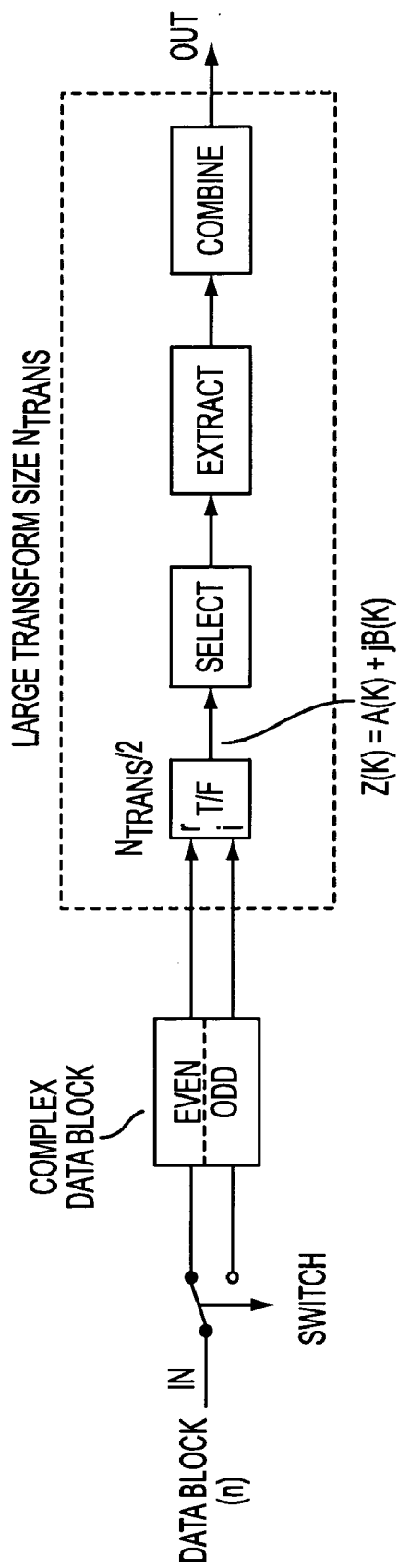
FIGS. 7A–E illustrate a second exemplary embodiment of the present invention, which involves processing one data block, containing real data, through a half-size, complex transform.

FIG. 7A illustrates the technique associated with the second exemplary embodiment of the present invention. As shown, one real data block n having a length $N_{trans}$ is divided into even and odd samples. The even and odd samples are then multiplexed into a complex data block of size $N_{trans}/2$. More particularly, the even samples are multiplexed into the real part (r) and the odd samples into the imaginary part (i) of the new complex data block. A complex transform T/F of length $N_{trans}/2$ is then performed, the results of which are given by $Z(k)= A(k)+jB(k)$, where k is an integer between 0 and $[N_{trans}/2-1]$.

Again, post-processing involves selection and extraction. The select algorithm simply collects the necessary output transforms, for an active channel, from the pipeline transform algorithm T/F. The necessary output transforms for any given channel are, as previously stated, defined as $A(k)+jB(k)$, where k is equal to $k_{start}$ through $k_{start}+(N-1)$, N being the number of output transforms associated with the channel. The even, EVEN(k), and odd, ODD(k), results are then extracted by the extraction algorithm using the following equations:

$$EVEN(k)=\{A(k)+A(N_{trans}-k)\}/2+j\{B(k)-B(N_{trans}-k)\}/2 \quad (14)$$

$$ODD(k)=\{B(k)+B(N_{trans}-k)\}/2+j\{A(N_{trans}-k)-A(k)\}/2 \quad (15)$$

where EVEN(k) and ODD(k) are the transforms associated with the even samples of the data block, even(n), and the odd samples of the data block, odd(n), respectively.

In this second exemplary embodiment of the present invention, post-processing also involves combining the EVEN(k) and ODD(k) transforms. However, only the EVEN(k) and ODD(k) results required for each channel are combined to form the useful part of the $N_{trans}$ point transform. The following equations are used for this purpose:

$$C(k)=\{EVEN(k)+(ODD(k)*W^k_{Ntrans})\} \quad (16)$$

$$C(N_{trans}/2 +k)=\{EVEN(k)-(ODD(k)*W^k_{Ntrans})\} \quad (17)$$

where k equals zero (0) through $[N_{trans}/2-1]$. In the case of the inverse transform, $W^k_{Ntrans}$ would be replaced with $W^{-k}_{Ntrans}$, and equation (17) would not be calculated as the input signal is real and, therefore, $C(N_{trans}-k)$ is the complex conjugate of C(k), for k equal to 1 through $[N_{trans}/2-1]$. This holds for both the MFC and filter bank based algorithms.

The second exemplary embodiment of the present invention requires less computation than similar prior techniques, as only the output transforms associated with each channel are calculated. For the MFC based algorithms, k spans across a number of bins, C(i), for each channel, where C(k) is significantly less than the size of the transform $N_{trans}$. In the case of filter bank based algorithms, k spans across one bin in the case of C(k). The resulting computational effort is, therefore, dramatically lower, which in turn, reduces the implementation delay attributable to the extraction algorithm, $\Delta_{ext}$, and the combine algorithm, $\Delta_{comb}$. In fact, the implementation delays associated with the extract and combine algorithms are negligible compared to similar prior techniques.

Figure 7C:
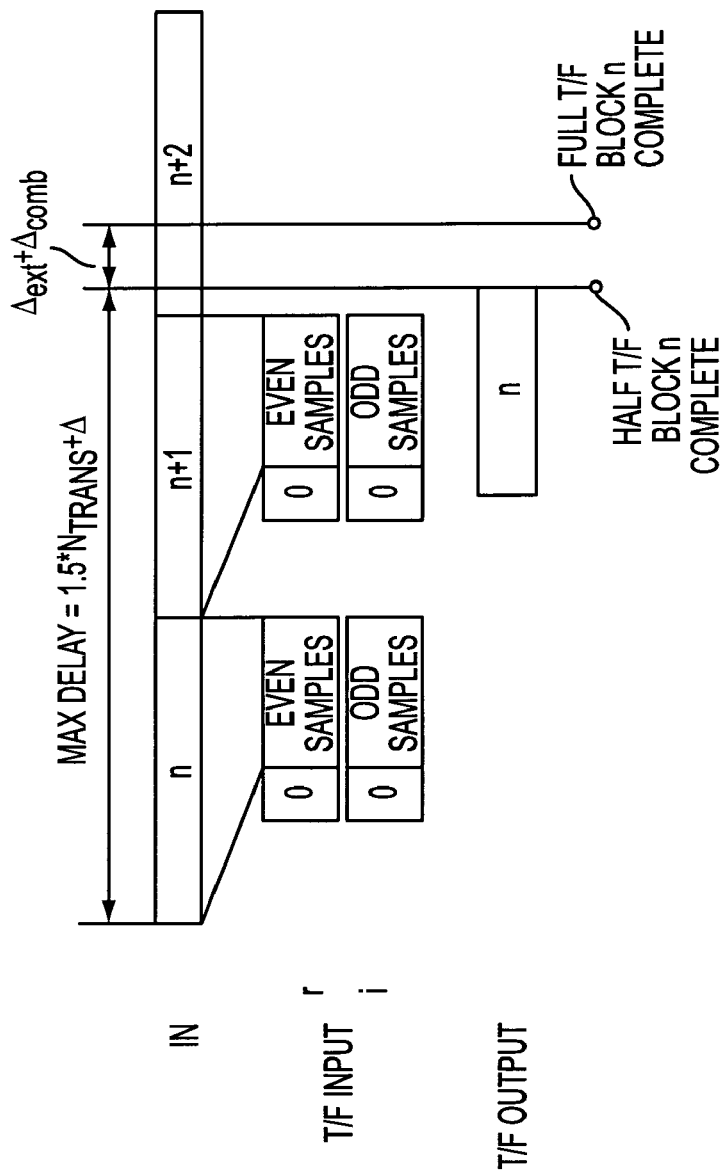
Figure 7D:
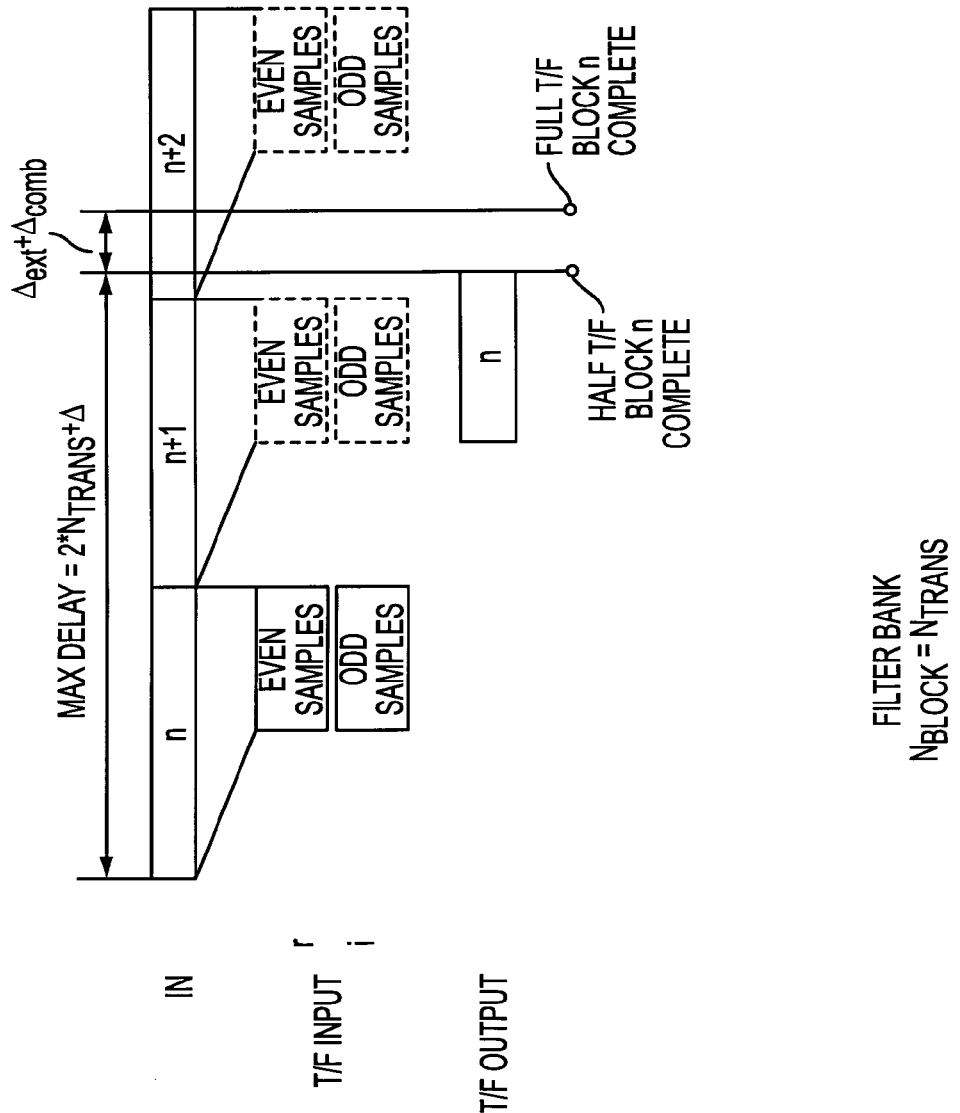

FIGS. 7B–D illustrate, in greater detail, the timing and processing delays associated with the second exemplary embodiment of the present invention, as applied to a MFC algorithm employing 50 percent overlap, a MFC algorithm employing 25 percent overlap, and a filter bank algorithm, respectively. These processing delays are further summarized in Table VIII below, wherein these delays are half that shown in the reference technique in Table II.

TABLE VIII

| ALGORITHM | $DELAY_{trans}$ |
|---|---|
| MFC with 50% overlap | $1 * N_{trans} + \Delta + \Delta_{ext} + \Delta_{comb} \approx N_{trans}$ |
| MFC with 25% overlap | $1.5 * N_{trans} + \Delta + \Delta_{ext} + \Delta_{ext} \approx 1.5N_{trans}$ |
| Filter Bank | $2 * N_{trans} + \Delta + \Delta_{ext} + \Delta_{ext} \approx 2N_{trans}$ |

Figure 7E:
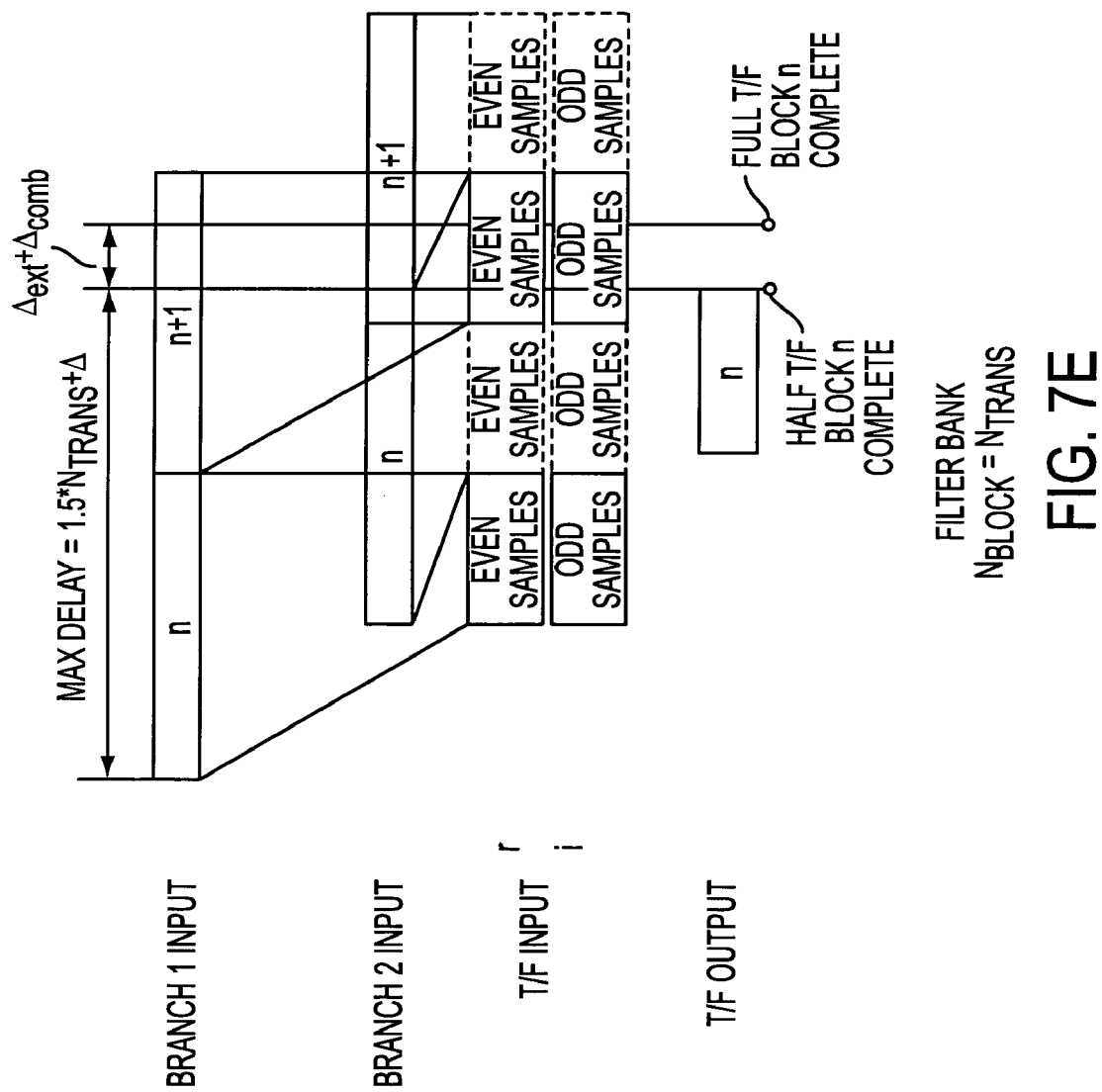

FIG. 7E illustrates the timing and processing delay associated with an alternative embodiment, wherein the concept of the first exemplary embodiment and the concept of the second exemplary embodiment are combined in the case of a filter bank based algorithm. Employing two diversity branches essentially increases the duty cycle of the pipeline transform, thus further reducing the processing delay from approximately $2N_{trans}$ to approximately $1.5N_{trans}$.

The arithmetic parameters for the second exemplary embodiment are summarized in Table IX below.

TABLE IX

| ALGORITHM | COMPLEXITY | DUTY CYCLE | EFFORT |
|---|---|---|---|
| MFC with 50% overlap | $\log_2(N_{trans}/2)$ | 1 | $1 * \log_2 N_{trans}$ |
| MFC with 25% overlap | $\log_2(N_{trans}/2)$ | 36220 | $\frac{2}{3} * \log_2 N_{trans}$ |
| Filter Bank | $\log_2(N_{trans}/2)$ | 36191 | $\frac{1}{2} * \log_2 N_{trans}$ |
| Filter Bank with Diversity | $\log_2(N_{trans}/2)$ | 1 | $\frac{1}{2} * \log_2 N_{trans}$ |

From Table IX, it can be seen that the arithmetic complexity and effort have been marginally decreased. The combining algorithm does involve, however, some additional processing as compared to the reference technique, and it may consume some additional die area and power consumption. Yet, the difference will be quite small on a per channel basis. In the special case of the filter bank algorithm with diversity, as illustrated in FIG. 7E, there is no additional increase in hardware, rather, the hardware is multiplexed between the two diversity branches. In this case, there would be a substantial reduction in die area.

Table X summarizes the memory requirements associated with the second exemplary embodiment. As shown in the table, the overall memory requirements are reduced due to the collection memory size. This reduces both die area and power consumption.

TABLE X

| ALGORITHM | COLLECTION MEMORY | TRANSFORM MEMORY | TOTAL MEMORY |
|---|---|---|---|
| MFC with 50% overlap | $N_{trans}/4$ | $N_{trans}$ | $1\frac{1}{4} * N_{trans}$ |
| MFC with 25% overlap | $3N_{trans}/8$ | $N_{trans}$ | $1\frac{3}{8} * N_{trans}$ |
| Filter Bank | $N_{trans}/2$ | $N_{trans}$ | $1\frac{1}{2} * N_{trans}$ |
| Filter Bank with Diversity | 0 | $N_{trans}$ | $N_{trans}$ |

Figure 7F:
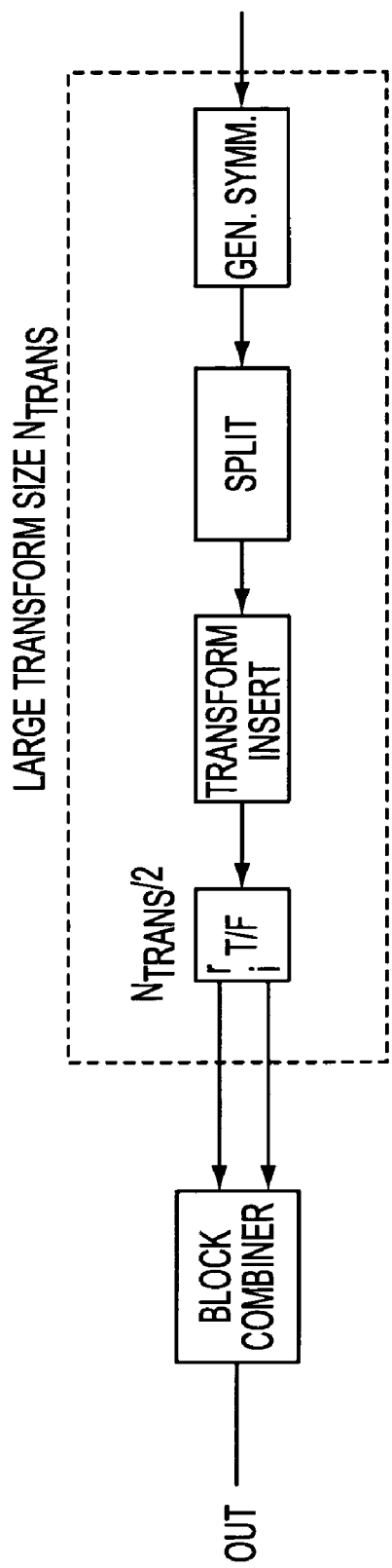

FIG. 7F illustrates the implementation of a de-channelizer algorithm in accordance with the second exemplary embodiment of the present invention. Again, the first step involves generating a symmetrical data vector, such that the real output from the total large transform contains the even time samples, while the imaginary output contains the odd time samples. This condition can occur if the bins are inserted in a symmetrical way. The reason for doing this is that the final block combining process becomes a simple multiplexing operation. The symmetrical generation equations for the even blocks are defined by equations (18) and (19) below:

$$Z(k_{start}+k)=X(k)/2 \tag{18}$$

$$Z(N_{Trans}-k_{start}-k)=X'(k)/2 \tag{19}$$

where X represents one block of channel data, and where k is defined as 0 to [N−1]. Note that N is, in general, significantly smaller than the transform size, and that N equals 1 in the case of a critically sampled filter bank algorithm. The transform vector for the blocks in which they are inserted is defined as Z(h), where h ranges from 0 to [$N_{trans}$−1]. The variable $k_{start}$ defines where the first bin of the channel is to be inserted and can be an integer number anywhere between 1 and [$N_{trans}$−1]. Additionally, more than one channel may be entered into the transform vector, which in the case of overlapping points in the transform vector they should be simply added.

The next process is then to split the input transform vector, Z(k), into a new transform vector of half the size. Z(k) is split into two vectors C(k) and D(k), which are then combined into a new vector E(k)=C(k)+jD(k) such that after the pipeline transform, the even results will be output in the real part of the transform and the odd results will be output on the imaginary part. The following equations (20) and (21) describe the splitting process:

$$C(k)=(Z(k)+Z(N_{Trans}/2+k)) \tag{20}$$

$$D(k)=(Z(k)-(Z(N_{Trans}/2+k)*W^k_{NTrans})) \tag{21}$$

where k=0 to [$N_{Trans}$/2−1]. In the case of the inverse transform, $W^k_{NTrans}$ would be replaced with $W^{-k}_{Ntrans}$. The data vector, E(k)=C(k)+jD(k), is then handled by the transform insert process, which simply inputs the transform vector into the pipeline transform in a bit reversed order, such that the pipeline transform output is in the correct order. After the resulting transform, the real output of the transform is equivalent to the even time samples of the large transform of size $N_{trans}$, whilst the imaginary output of the transform is equivalent to the odd time samples of the large transform of size $N_{trans}$.

The block combiner for the Filter Bank based algorithms simply pipes the data through the polyphase filter implementation, which is considered here to be a unity operation. For the MFC based algorithms, the block combiner overlaps the consecutive blocks by a length of $\eta N_{trans}$. In the overlap and add version, the overlapping part is added to the previous blocks corresponding overlapping section, while for overlap and save version the overlapping section of the block is simply discarded. For both overlap and add and overlap and save, there are no operation performed on the non-overlapped section.

In summary, the second exemplary embodiment of the present invention reduces the processing delay by approximately 50 percent. It also reduces power consumption, as well as the die area and the overall memory requirements. For the alternative embodiment that employs a filter bank algorithm with diversity, the arithmetic complexity is also reduced by approximately half.

A third exemplary embodiment of the present invention involves the processing of one data block containing real data through a half-size, complex transform, which has been reduced to a "butterfly" and two partial pipeline transforms. Moreover, this third exemplary embodiment combines the concept of diversity, as in the first exemplary embodiment described above, to improve resource utilization.

In accordance with this third exemplary embodiment, two important concepts are combined to reduce delay. First, a half-sized transform is reduced to a butterfly and two partial transforms. Second, diversity is employed, thus increasing the duty cycle of the transform, causing better utilization of resources.

Figure 8A:
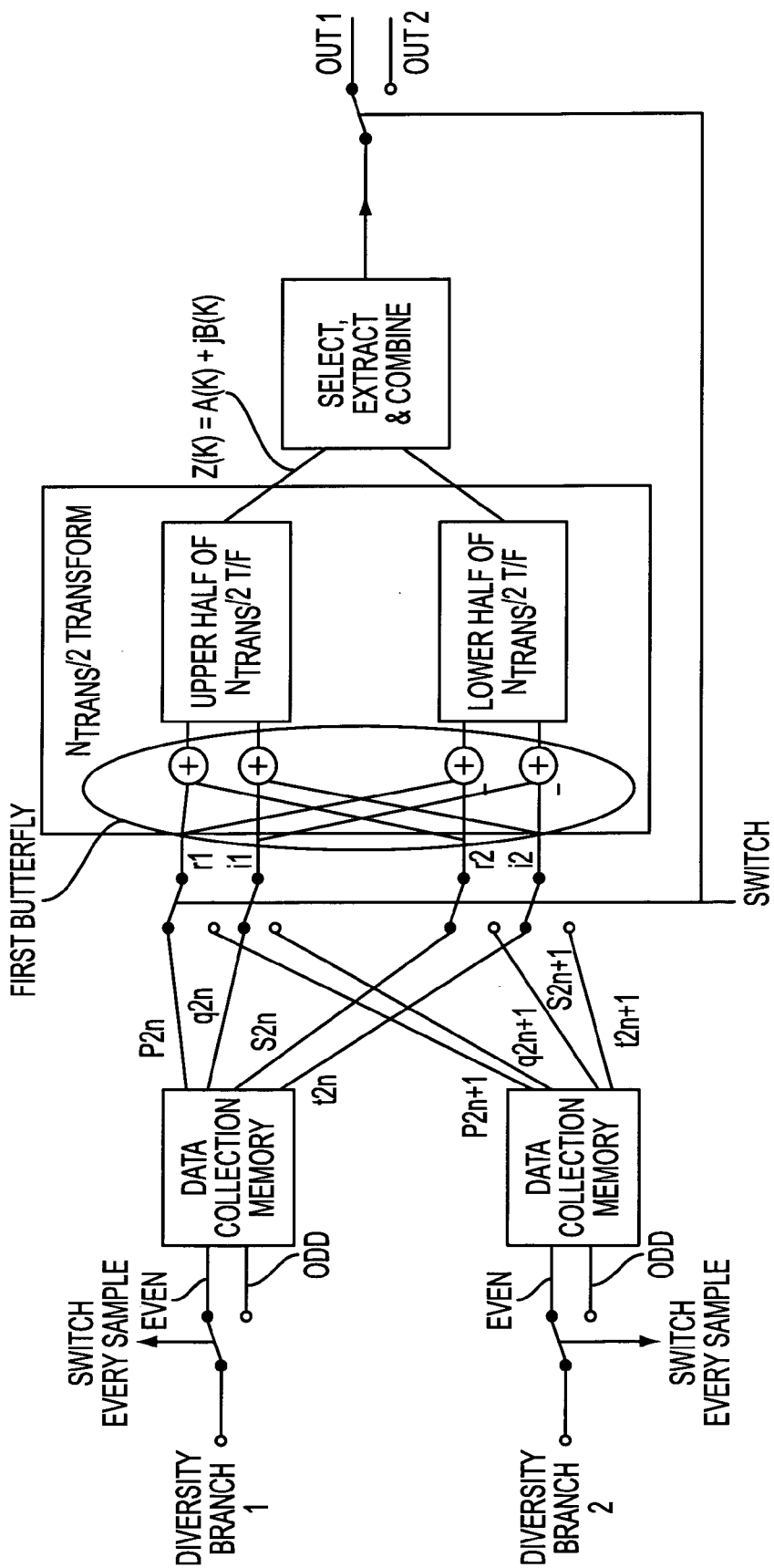
FIGS. 8A–E illustrate a third exemplary embodiment of the present invention, which involves the processing of one data block, containing real data, through a half-size, complex transform, which has been reduced to a "butterfly" and two partial pipeline transforms.
Figure 8B:
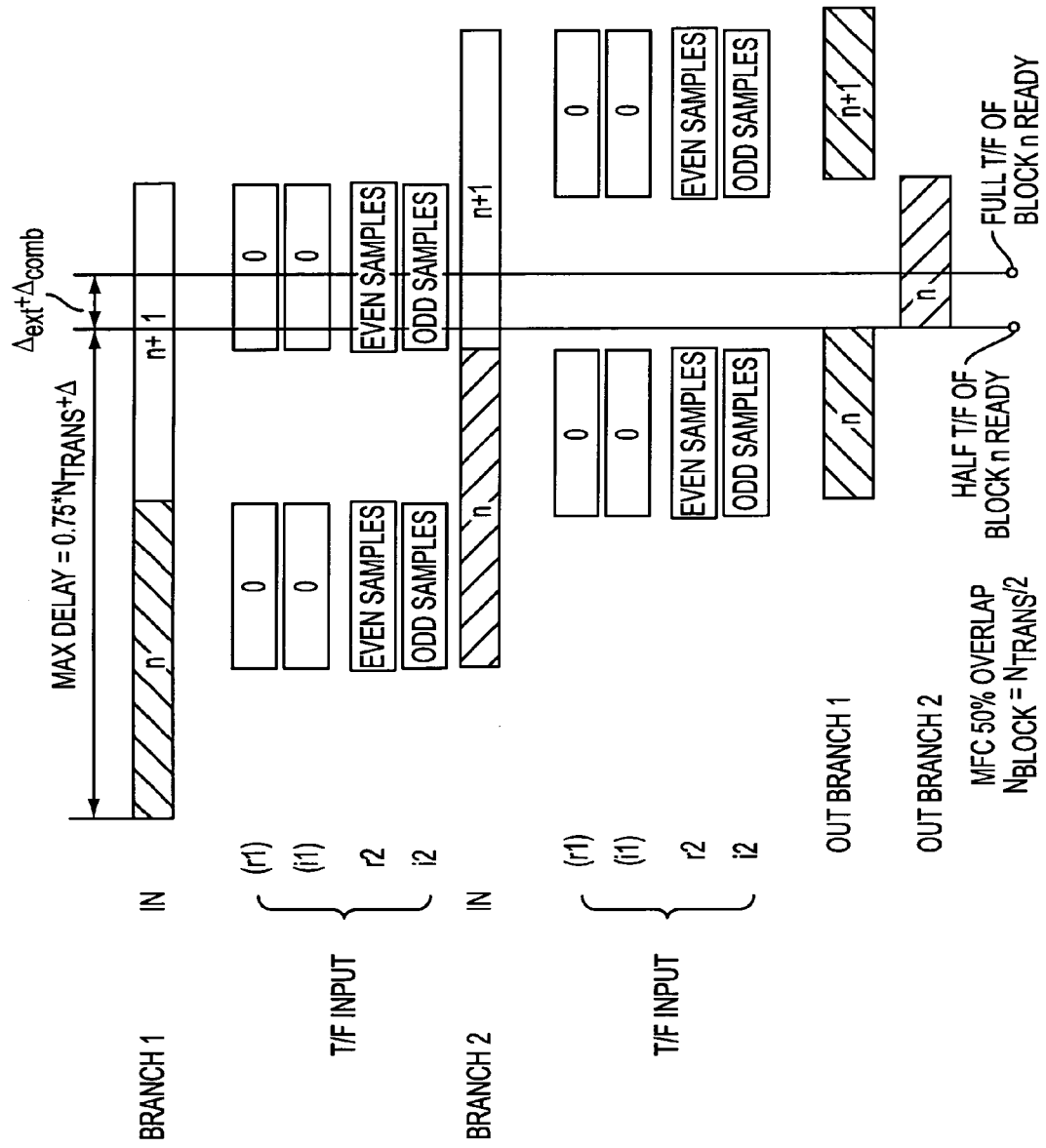
Figure 8C:
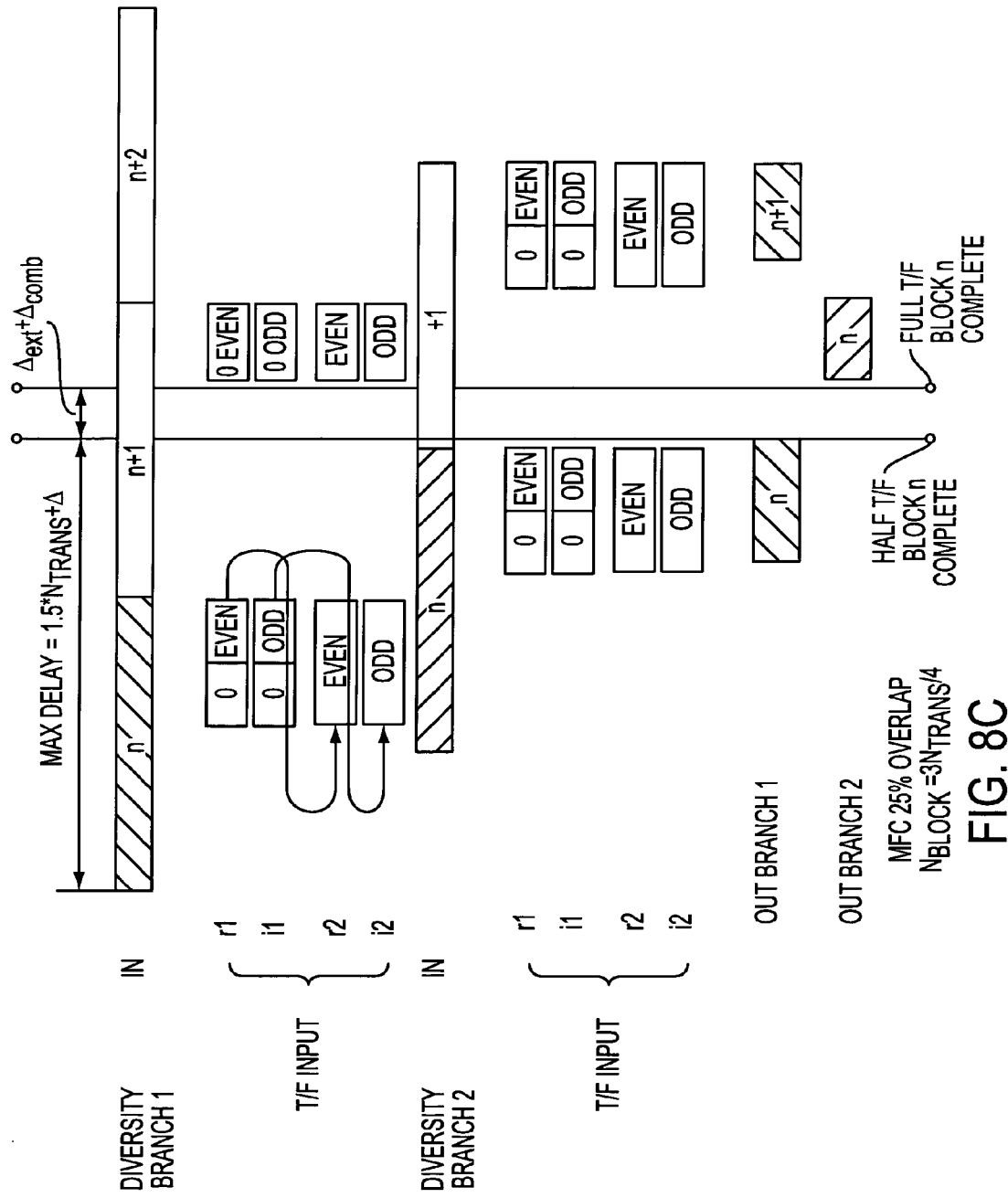
Figure 8D:
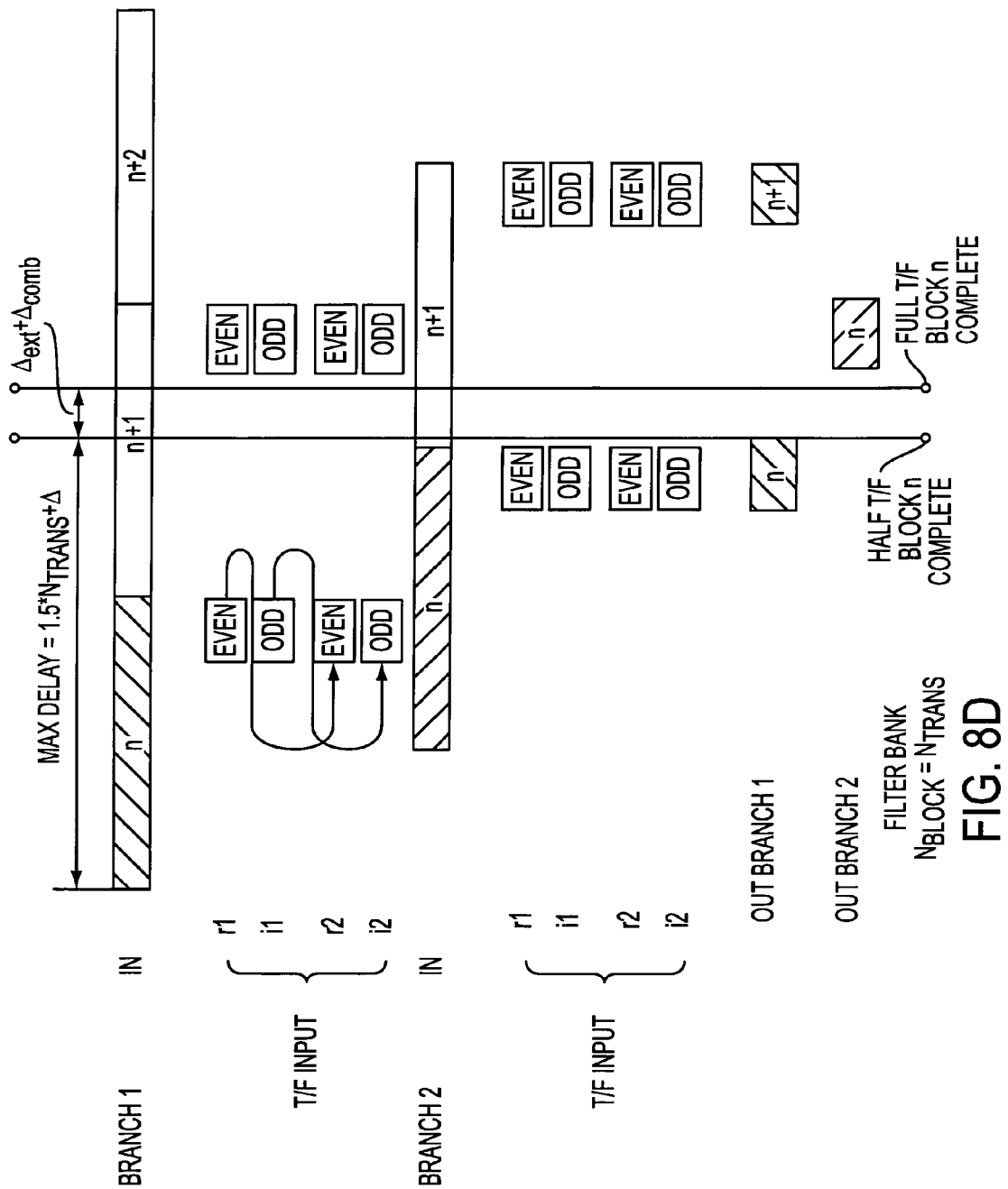

FIG. 8A illustrates the third exemplary embodiment of the present invention, wherein a first butterfly is employed as a parallel implementation of additions and subtractions combined with two partial pipeline transforms. One of the partial transforms is the upper half of a $N_{trans}/2$ transform and the other partial transform is the lower half of the $N_{trans}/2$ transform. Together they produce a $N_{trans}/2$ transform, from which specific channel results are selected, extracted and combined to form a $N_{trans}$ point transform, as is illustrated in FIGS. 8B–D, which pertain to a MFC algorithm with 50 percent overlap, a MFC algorithm with 25 percent overlap, and a filter bank algorithm respectively. The major benefit over the reference technique, which does not employ diversity, is that the pipeline transform size is reduced, thereby reducing delay. In addition, the hardware is utilized for a larger proportion of the time, thereby reducing the overall hardware requirements.

The data collection memory functions shown in FIG. 8A convert the data input, even and odd samples, into two complex data blocks, $p_b(k)+j\ q_b(k)$ and $s_b(k)+j\ t_b(k)$, of size $N_{trans}/4$. The first diversity branch generates two complex blocks at even increments in time, i.e., b=2n, whereas the second diversity branch generates two complex blocks at odd increments in time, i.e., b=2n+1, as shown in FIGS. 8B–D.

The data collection memory function collects the even and odd samples of the input data and pads it with zeros, such that the total number of even or odd samples equals $N_{trans}/2$. The number of zeros is dependent upon the system configuration. For instance, in the case of a MFC algorithm, the number of zeros equals $h*N_{trans}/2$. In the case of the filter bank algorithm, the number of zeros equals 0.

The $N_{trans}/2$ even samples are then multiplexed into the real parts, wherein $P_b$ equals even(k), k having values from 0 to ($N_{trans}/4$)−1, and wherein $S_b$ equals even(k), k having values from $N_{trans}/4$ to ($N_{trans}/2$)−1. The $N_{trans}/2$ odd samples are multiplexed into the imaginary parts wherein $q_b$ equals odd(k), k having values from 0 to ($N_{trans}/4$)−1, and wherein $t_b$ equals odd(k), k having values from $N_{trans}/4$ to ($N_{trans}/2$)−1. It should be noted that the even and odd samples could also be multiplexed into the imaginary and real parts respectively.

The two complex blocks are then multiplexed into the transform:

$$r1+j*i1=p_b(k)+j\ q_b(k)$$

$$r2+j*i2=S_b(k)+j\ t_b(k)$$

where the first and second diversity branches supply the data at even and odd increments in time, b, respectively.

The upper partial transform of length $N_{trans}/4$ is then performed on the vector {r1(k)+r2(k)}+j{i1(k)+i2(k)}, and the lower partial Transform of length $N_{trans}/4$ is performed on the vector {r1(k)−r2(k)}+j{i1(k)−i2(k)}, where k equals zero (0) through [$N_{trans}/4$−1]. The upper and lower partial transforms output even and odd results of length $N_{trans}/2$.

The transform results are, once again, given by $Z(k)=A(k)+jB(k)$, where k is an integer between 1 and $[N_{trans}/2 -1]$.

From the transform result, the select algorithm simply collects the necessary transforms generated by the pipeline Transform algorithm, which are being output in a bit reversed order. The necessary transform outputs for any channel are also, once again, defined as $A(k)+jB(k)$, where k equals $k_{start}$ to $[k_{start}+(N-1)]$, where the variable N defines the number of transform outputs associated with a specific channel.

The results required for each channel are then extracted using the formulas described in equation (14) and equation (15). The extracted results, $EVEN(k)$ and $ODD(k)$, are then combined using equation (16) to form the useful points in an $N_{trans}$ point transform. The blocks coming out of the combining process are switched sequentially between the first and second output to correspond with the switching process at the input.

The processing delays illustrated in FIGS. 8B–D are summarized in Table XI below.

TABLE XI

| ALGORITHM | DELAY$_{trans}$ |
|---|---|
| MFC with 50% overlap | $0.75 * N_{trans} + \Delta + \Delta_{ext} + \Delta_{comb} \approx 0.75 N_{trans}$ |
| MFC with 25% overlap | $1.125 * N_{trans} + \Delta + \Delta_{ext} + \Delta_{ext} \approx 1.125 N_{trans}$ |
| Filter Bank | $1.5 * N_{trans} + \Delta + \Delta_{ext} + \Delta_{ext} \approx 1.5 N_{trans}$ |

Figure 8E:
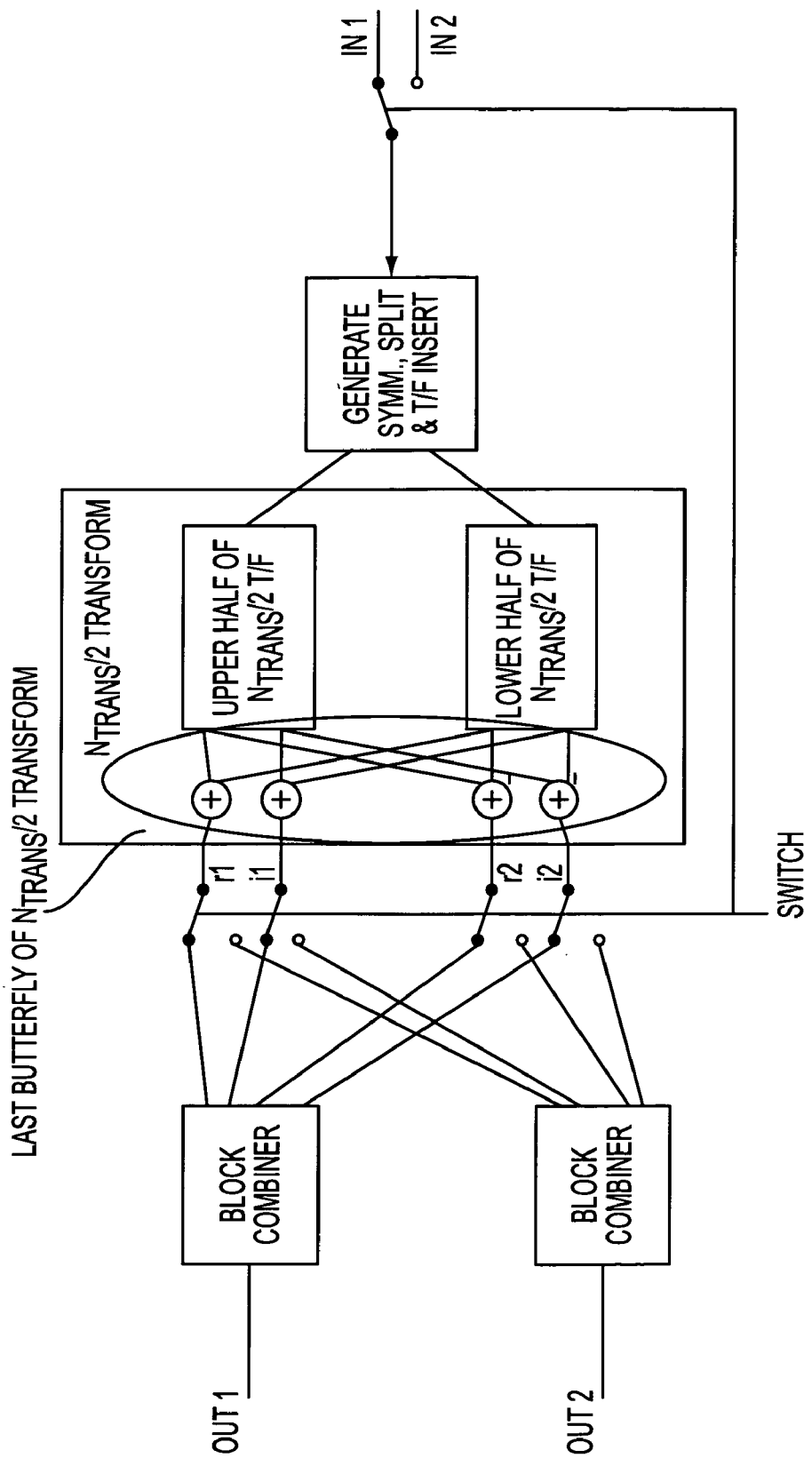

As the first and the second exemplary embodiments of the present invention were applicable to de-channelizer algorithms, so too is the third exemplary embodiment. FIG. 8E illustrates the configuration of a de-channelizer algorithm in accordance with the third exemplary embodiment of the present invention. In accordance with FIG. 8E, the de-channelizer algorithm first involves the step of generating a symmetrical data vector, such that the real and imaginary outputs from the total transform output contain the even and odd time samples of the transmitted data. This condition nay occur if the bins are inserted in a symmetrical way. The reason for doing this is that the final block combining process becomes a simple multiplexing operation. The symmetrical generation equations for the blocks generated by input 1 and 2 are defined by equations (18) and (19) above, where $Z(k)$ is the resulting transform vector.

The next process involves splitting the input transform vector, $Z(k)$, into a new transform vector of half the size. $Z(k)$ is split into two vectors $C(k)$ and $D(k)$, which are then combined into a new vector $E(k)=C(k)+jD(k)$ such that after the pipeline transform, the even results will be output in the real part of the transform and the odd results will be output on the imaginary part. Equations (20) & (21) describe the splitting process.

The data vector $E(k)$ is then handled by the transform insert process, which first splits $E(k)$ into upper and lower parts defined by k=even and k=odd respectively. These two new vectors are then input into the upper and lower halves of the $N_{trans}/2$ pipeline transforms in bit reversed order. The partial results from the upper and lower transforms are then combined in the last butterfly, wherein:

$r1(k)=real(Upper(k)+Lower(k));$ $i1(k)=imaginary(Upper(k)+Lower(k));$ $r2(k)=real(Upper(k)+Lower(k));$ and $i2(k)=imaginary(Upper(k)-Lower(k)),$ where k equals 0 through $[(N_{trans}/4)-1]$, and where $Upper(k)$ and $Lower(k)$ refer to the complex results of the Upper and Lower half of a $N_{trans}/2$ transform respectively.

The real outputs of the transforms, r1 and r2 are equivalent to the even time samples, and the imaginary outputs of the transforms, i1 and i2 are equivalent to the odd time samples of the equivalent large transform of size $N_{trans}$.

The block combiner demultiplexes r1, r2, i1 and i2 into a single real data stream that is then transmitted further. This demultiplexing process is dependant upon the system configuration, i.e., an MFC algorithm or a Filter Bank Algorithm.

Furthermore, the above process is time shared between the two input streams which are intended for the two diversity transmission paths, such that the resources are best utilized.

In some situations, the hardware can be better utilized. For example, an MFC algorithm with 25 percent overlap only utilizes the hardware ⅔ of the time. Thus, in accordance with an alternative to the third exemplary embodiment of the present invention, an additional diversity branch is employed to improve the utilization of the hardware.

Figure 9A:
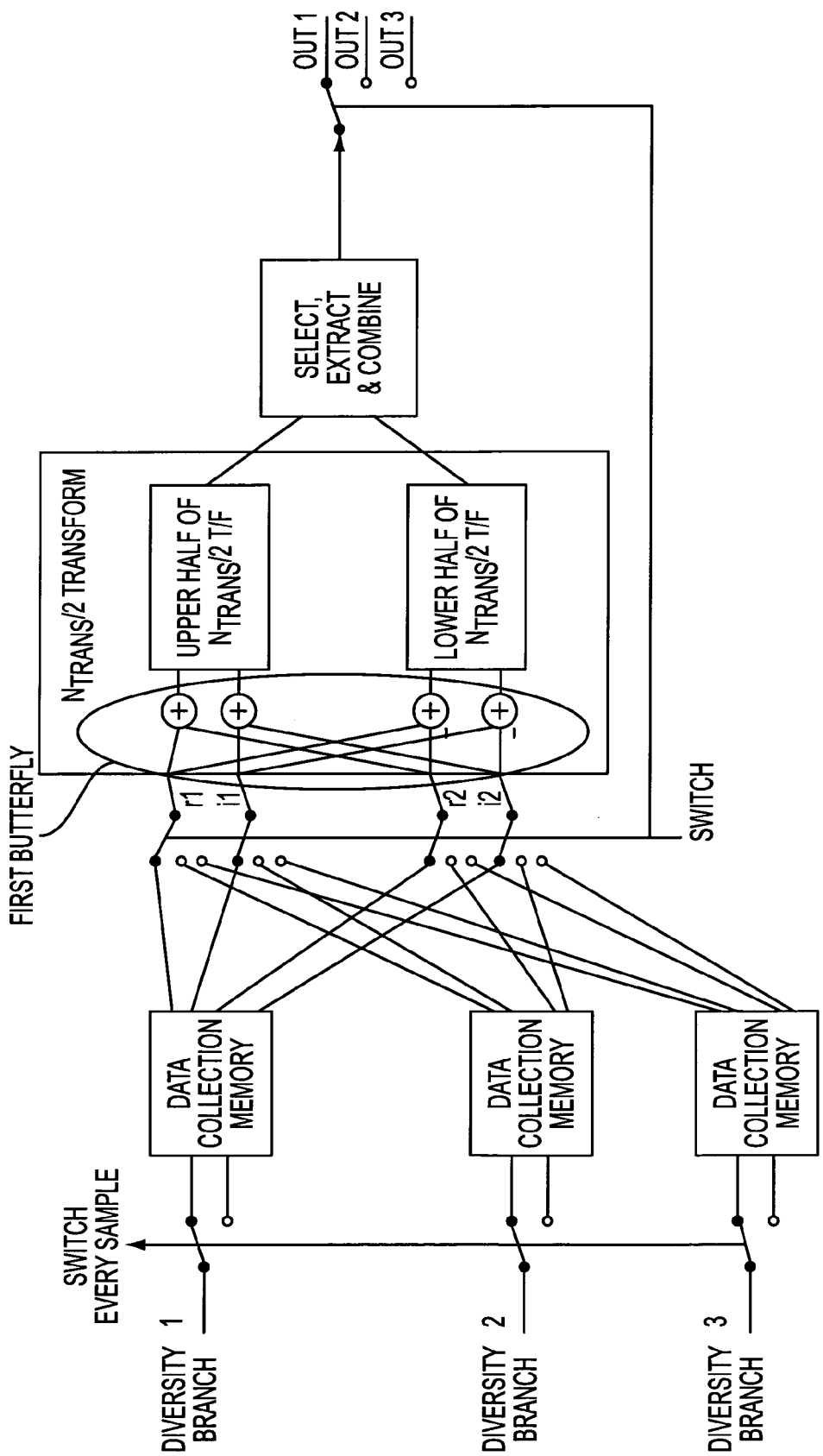
FIGS. 9A–9B illustrate an alternative to the third exemplary embodiment of the present invention wherein an additional diversity branch is employed to improve the utilization of the hardware, and reduce processing delays.
Figure 9B:
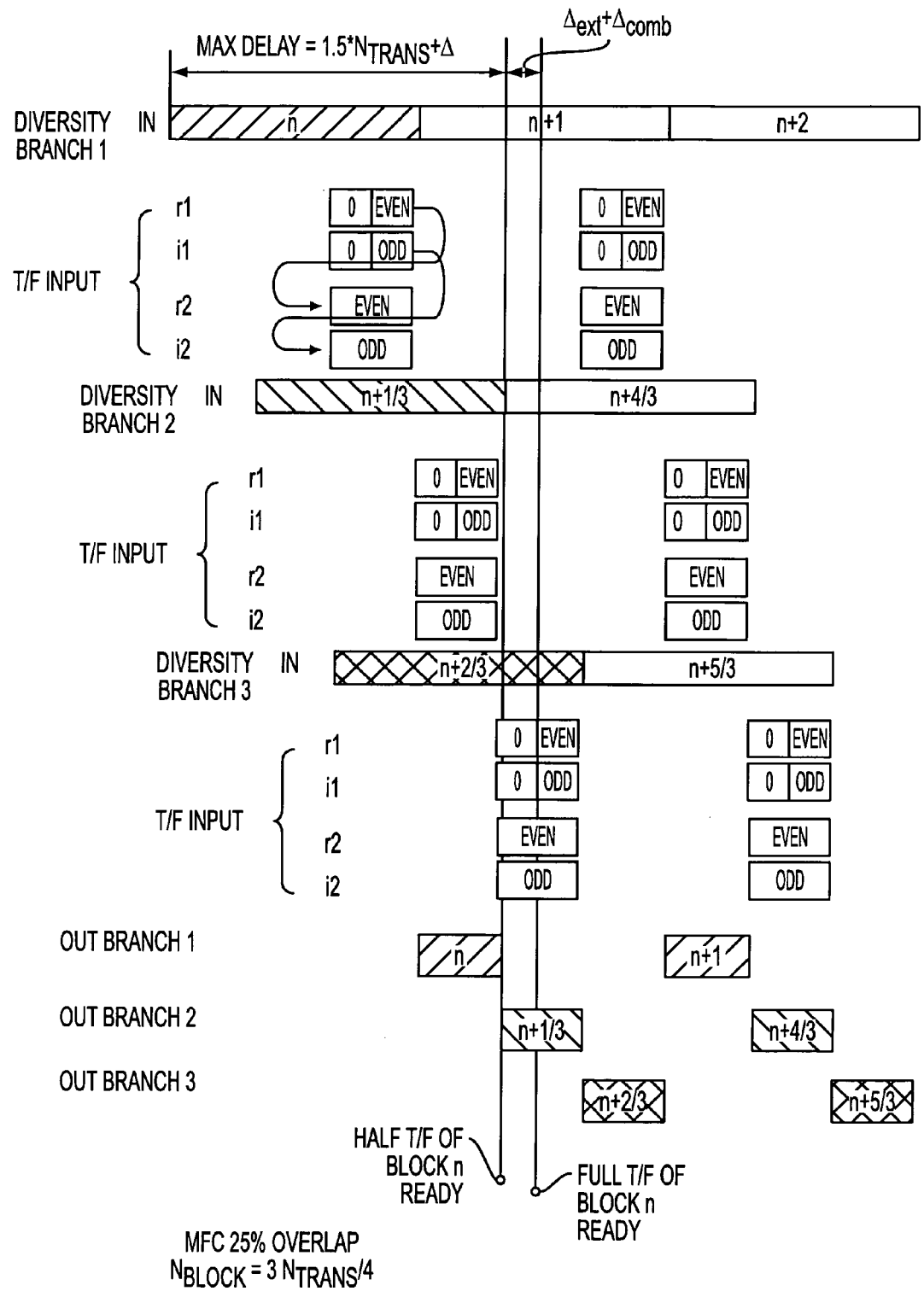

FIG. 9A illustrates this alternative to the third exemplary embodiment, wherein a MFC algorithm with 25 percent overlap, for example, employs three diversity branches in transforming one real data block with one complex transform of size $M_{trans}$ the quantity divided by 2. This alternative embodiment results in still further reductions in processing delays from $1.25*N_{trans}$, in the case of a MFC algorithm with 25 percent overlap, to $1*N_{trans}$, as shown in the corresponding timing diagram illustrated in FIG. 9B.

Another example of this alternative embodiment might involve a filter bank algorithm employing four channel diversity. In this example, additional hardware would be needed as compared with the two diversity branch configuration illustrated in FIG. 9A, but the hardware would be actively constantly (i.e., a duty cycle of 1). Again, this alternative embodiment results in a further reduction of the processing delays from $1.75*N_{trans}$, in the case of a filter bank algorithm, to $1.25*N_{trans}$.

The arithmetic parameters for the third exemplary embodiment are summarized in Table XII below, where it is shown that the overall arithmetic complexity and effort decreases in comparison with the reference technique. It should, however, be noted that the arithmetic complexity does not include the first butterfly stage which consists of four adders, as this is considered negligible for large transforms. Also, the combined algorithm does involve additional processing as compared with the reference technique. This, in turn, results in extra die area and power consumption; however, the additional die area and power consumption is quite small of a per channel basis. As for the two alternative embodiments described above, that is, the MFC algorithm with 25 percent overlap employing three diversity branches, and the filter bank algorithm employing four diversity branches, there is no additional increase in hardware. Rather, the existing hardware is simply multiplexed between more diversity branches and is therefore, constantly activated. In fact, these alternative embodiments would result in a substantial savings with respect to die area.

TABLE XII

| ALGORITHM | COMPLEXITY | DUTY CYCLE | EFFORT |
|---|---|---|---|
| MFC with 50% overlap | $2 * \log_2(N_{trans}/4)$ | 1 | $1 * \log_2 N_{trans}/4$ |
| MFC with 25% overlap | $2 * \log_2(N_{trans}/4)$ | 36220 | $⅔ * \log_2 N_{trans}/4$ |

TABLE XII-continued

| ALGORITHM | COMPLEXITY | DUTY CYCLE | EFFORT |
|---|---|---|---|
| MFC with 25% overlap (3 Diversity Branches) | $2 * \log_2(N_{trans}/4)$ | 1 | $\frac{2}{3} * \log_2 N_{trans}/4$ |
| Filter Bank | $2 * \log_2(N_{trans}/4)$ | 36191 | $1 * \log_2 N_{trans}/4$ |
| Filter Bank (4 Diversity Branches) | $2 * \log_2(N_{trans}/4)$ | 1 | $1 * \log_2 N_{trans}/4$ |

Table XIII below summarizes the memory requirements associated with the third exemplary embodiment. As indicated, the overall memory requirements are less than or equal to the memory requirements associated with the reference technique. It should be noted that the required amount of collection memory could be further reduced in each case by sharing memory across the diversity branches. In general, lower memory requirements reduce both die area and power consumption.

After the $N_{trans}/2$ transform, there are two real outputs, which are equivalent to the even time samples of the large transform of size $N_{trans}$, and two imaginary outputs, which are equivalent to the odd time samples of the large transform of size $N_{trans}$. These outputs are directed to either the first or second diversity branch, depending on the position of the input switch.

The block combiner for the filter bank based algorithms simple multiplexes together the even and odd data streams for use in the polyphase filter implementation, which is considered here to be a unity operation. For the MFC based algorithms, the block combiner first multiplexes together the even and odd data streams to form a complete block, and then overlaps the consecutive blocks by a length of $\eta N_{trans}$. In the overlap and add version, the overlapping is added to the corresponding overlapping section of the previous block, while for the overlap and save version, the overlapping section of the block is simply discarded. For both overlap and add and overlap and save, there are no operations performed on the non-overlapping section.

In summary, the third exemplary embodiment reduces processing delays by 60–70 percent over the reference technique. Moreover, power consumption and die area are reduced, as is the overall memory requirements.

TABLE XIII

| ALGORITHM | COLLECTION MEMORY | TRANSFORM MEMORY | TOTAL MEMORY |
|---|---|---|---|
| MFC with 50% overlap | $2 * N_{trans}/4$ | $N_{trans}$ | $1\frac{1}{2} * N_{trans}$ |
| MFC with 25% overlap | $2 * N_{trans}/4$ | $N_{trans}$ | $2 * N_{trans}$ |
| MFC with 25% overlap (3 Diversity Branches) | $3 * N_{trans}/2$ | $N_{trans}$ | $2\frac{1}{2} * N_{trans}$ |
| Filter Bank | $N_{trans}$ | $N_{trans}$ | $2 * N_{trans}$ |
| Filter Bank (4 Diversity Branches) | $2 * N_{trans}$ | $N_{trans}$ | $3 * N_{trans}$ |

In accordance with the three exemplary embodiments described above, the 20 combination stage in the channelizer, and the generation stage in the de-channelizer, employ two-point transforms, i.e., a radix-2 decomposition of the large transform is used. However, as stated previous, it is possible to use higher radix decomposition. For example, a more computationally efficient technique might involve the use of a radix-4, or higher, decomposition.

A radix-4 transform does multiplication on 75 percent of the points every second stage. As compared with a radix-2 transform which multiples 50 percent of the points in every stage. It is, in principle, also possible to use radices that are not powers of 2, e.g., 3 or 10, although it depends on the application whether this is desirable and/or efficient.

Using higher radices makes it easier to use many diversity branches, since the layers of butterflies for data distribution into the parallel transform parts can be avoided.

Figure 10:
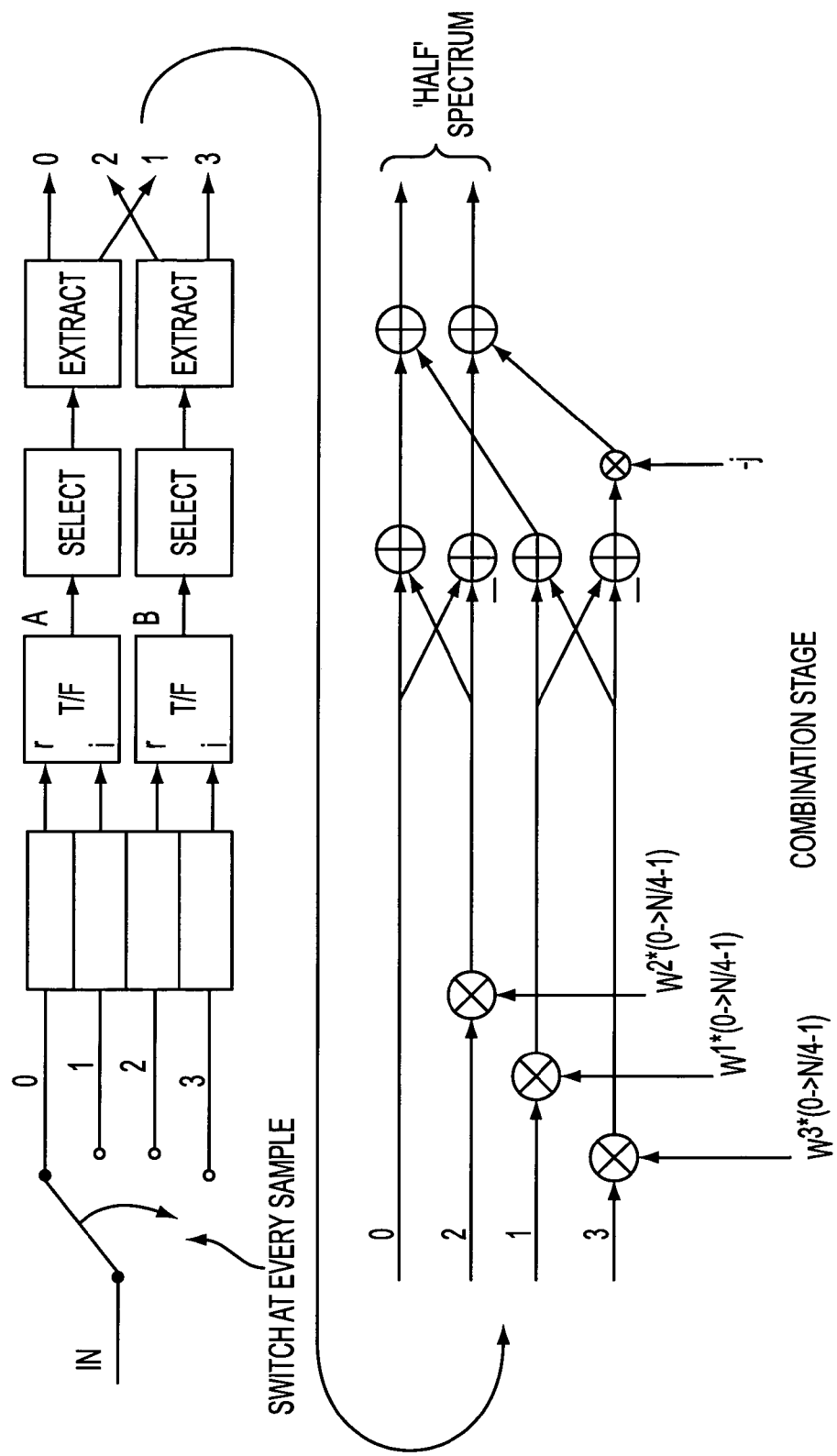
FIG. 10 illustrates a large transform in which the combination stage involves a radix-4 transform.

FIG. 10 illustrates a large transform in which the combination stage involves a radix-4 transform. As shown, the input signal is divided into four parts 0–3. The parts may be independently transformed, and later combined to form a large transform. The two transforms A and B are first processed in the same way as the radix-2 variety, and the individual transforms belonging to one of the four input parts are extracted.

Figure 11:
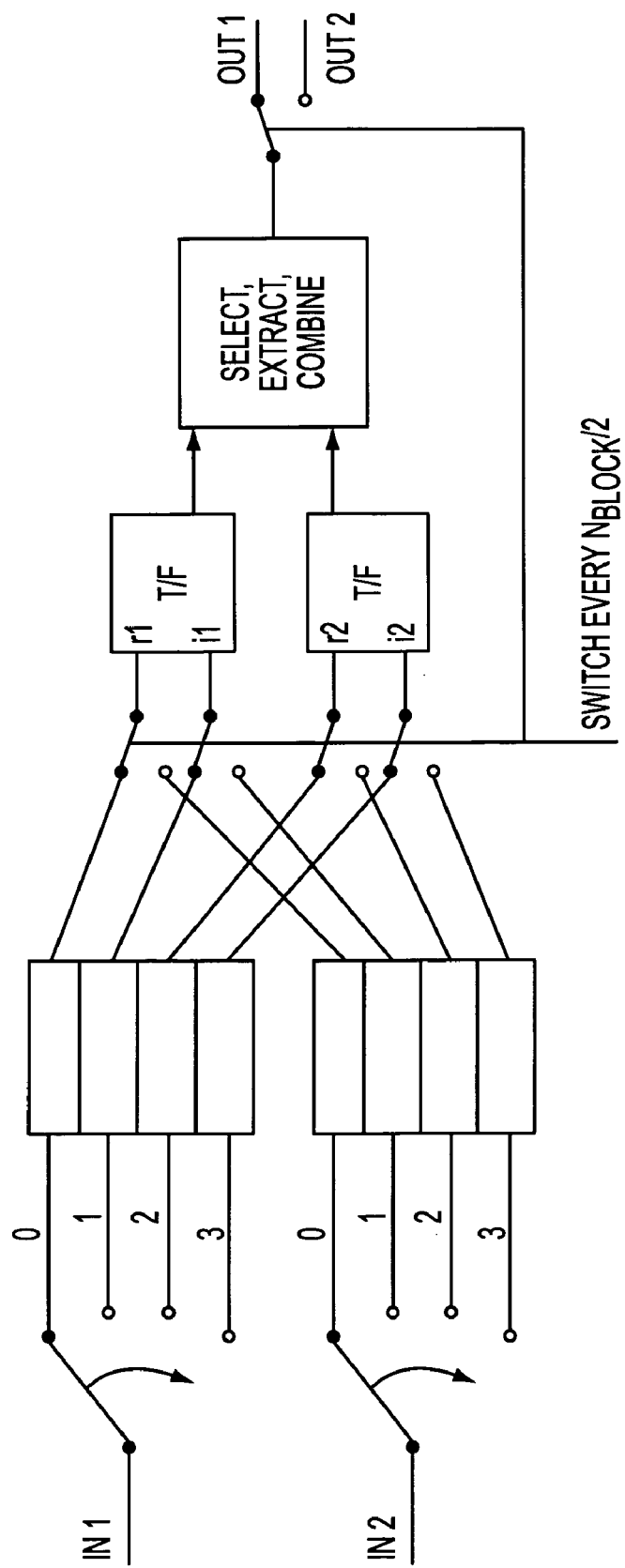
FIG. 11 illustrates a large transform in which a radix-4 combination stage is combined with two diversity branches.

FIG. 11 shows an example of a radix-4 combination with two diversity branches. The transform hardware consists of two transform processors.

Each of the three exemplary embodiments described above reduce the processing delay associated with a common processing part of fourier based channelizer and de-channelizer algorithms, e.g., MFC and filter bank based algorithms. They accomplish this by intelligently multiplexing data from at least one diversity branch and configuring the transform such that the processing delay is reduced. The arithmetic complexity, arithmetic effort and memory requirements in all cases are also reduced. This results in less die area and power consumption. In some cases, the arithmetic complexity and die area are significantly reduced.

The present invention has been described with reference to several exemplary embodiments. However, it will be readily apparent to those skilled in the art that it is possible to embody the invention in specific forms other than those described above without departing from the spirit of the invention. The various aspects and exemplary embodiments are illustrative, and they should not be considered restrictive in any way. The scope of the invention is given by the appended claims, rather than the preceding description, and all variations and equivalents thereof which fall within the range of the claims are intended to be embraced therein.

What is claimed is:

1. In a telecommunications receiver that includes a plurality of reception branches, a channelization method comprising the steps of:

receiving an input data block from a reception branch, wherein said input data block has a length equal to $N_{trans}$;

sampling data associated with the input data block into a first set of data samples and a second set of data samples, wherein the first set of data samples comprises even data samples, and wherein the second set of data samples comprises odd data samples;

generating two complex blocks from the first set of data samples and the second set of data samples, wherein the first set of date samples is multiplexed into a real part of each of the two complex blocks, and wherein the second set of data samples is multiplexed into an imaginary part of each of the two complex blocks;

multiplexing the two complex blocks into an $N_{trans}/2$ Fourier transform; and demultiplexing frequency domain data generated by the Fourier transform into one or more sequences of frequency blocks;

wherein said step of demultiplexing the transformed blocks into one or more sequences of frequency blocks comprises the steps of:

selectively collecting the frequency domain data associated with active channels, which is generated by the $N_{trans}/2$ Fourier transform;

extracting from said selectively collected frequency domain data, data associated with the real part of the two complex data blocks and data associated with the Imaginary part of the two complex data blocks; and combining the extracted data to form a necessary portion of an $N_{trans}$-point transform.

2. The method of claim 1, wherein the Fourier transform is a radix-2 transform, or a higher radix transform.

3. The method of claim 1, wherein the Fourier transform is part of a Modified Fast Convolution algorithm.

4. The method of claim 1, wherein the Fourier transform is part of a filter bank algorithm.

5. The method of claim 1, wherein the input data block is simultaneously received over a plurality of reception branches.

6. In a telecommunications receiver that includes a plurality of reception branches, a channelization method comprising the steps of:

receiving an input data block from a reception branch, wherein said input data block has a length equal to $N_{trans}$.

sampling data associated with the input data block into a first set of data samples and a second set of data samples, wherein the first set of data samples comprises even data samples, and wherein the second set of data samples comprises odd data samples;

generating two complex blocks from the first set of data samples and the second set of data samples, wherein the first set of data samples is multiplexed into a real part of each of the two complex blocks, and wherein the second set of data samples is multiplexed into an imaginary part of each of the two complex blocks;

multiplexing the two complex blocks into an $N_{trans}/2$ Fourier transform; and demultiplexing frequency domain data generated by the Fourier transform into one or more sequences of frequency blocks;

wherein said Fourier transform processes each of the two complex data blocks through a transform that has been reduced to a "butterfly" and two partial transforms, and wherein a first one of the two partial transforms serves as an upper half of an $N_{trans}/2$ transform, while the second of the two partial transforms serves as a lower half of the $N_{trans}/2$ transform.

7. The method of claim 6, wherein the Fourier transform is a radix-2 transform, or a higher radix transform.

8. The method of claim 6, wherein the Fourier transform is part of a Modified Fast Convolution algorithm.

9. The method of claim 6, wherein the Fourier transform is part of a filter bank algorithm.

10. The method of claim 6, wherein the input data block is simultaneously received over a plurality of reception branches.

11. In a telecommunications transmitter, a de-channelization method comprising the steps of:

multiplexing one or more sequences of frequency blocks into a Fourier transform of length $N_{trans}/2$, wherein the Fourier transform generates a real and an imaginary output; and combining the real and the imaginary data outputs so as to form a single transmitted data stream;

wherein said step of multiplexing one or more sequences of frequency blocks into the Fourier transform of length $N_{trans}/2$ comprises the steps of:

generating a symmetrical transform vector for each active channel;

splitting the symmetrical transform vector, associated with the active channels, into two half-sized transform vectors;

recombining the two half-sized transform vectors, associated with the active channels, into a new complex transform vector, wherein a real portion of the new complex transform vector comprises a first one of the two half-sized transform vectors, and wherein an imaginary portion of the new complex transform vector comprises a second one of the two half-sized transform vectors; and inputting the new complex transform vector, associated with each of the active channels, into the Fourier transform of length $N_{trans}/2$ in bit reverse order.

12. The method of claim 11, wherein the Fourier transform is a radix-2 transform, or a higher radix transform.

13. The method of claim 11, applied to the Fourier transform part of a Modified Fast Convolution algorithm.

14. The method of claim 11, applied to the Fourier transform part of a filter bank algorithm.

15. The method of claim 11, wherein said step of combining the real and the imaginary data outputs comprises the step of:

using a polyphase filter to combine the real and imaginary data outputs.

16. In a telecommunications transmitter that includes a plurality of transmission branches, a dechannelization method comprising the steps of:

generating a symmetrical transform vector, for each active channel, from frequency domain data;

splitting the symmetrical transform vector, associated with each of the active channels, into a first partial half-sized transform vector and a second partial half-sized transform vector;

generating a new transform vector, associated with each of the active channels, wherein the new transform vector comprises a real component, which is based on the first half-sized transform vector, and an Imaginary component, which is based on the second half-sized transform;

splitting the new transform vector, associated with each of the active channels, into an upper portion and a lower portion;

inputting the upper and lower half of the new transform vector, associated with each of the active channels, into an upper half and a lower half of a Fourier transform of length $N_{trans}/2$, respectively;

combining time domain outputs from the upper half of the Fourier transform and from the lower half of the Fourier transform using a parallel implemented butterfly operation so as to produce two complex blocks;

inputting the two complex blocks into a combining block associated with one of the transmission branches; and demultiplexing real parts of the two complex blocks and imaginary parts of the two complex blocks into a single stream of real data prior to transmission.

17. The method of claim 16, wherein the Fourier transform is a radix-2 transform, or a higher radix transform.

18. The method of claim 16, wherein the Fourier transform is part of a Modified Fast Convolution algorithm.

19. The method of claim 16, wherein the Fourier transform is part of a filter bank algorithm.

* * * * *

UNITED STATES PATENT AND TRADEMARK OFFICE
CERTIFICATE OF CORRECTION

PATENT NO. : 6,973,135 B1
APPLICATION NO. : 09/610612
DATED : December 6, 2005
INVENTOR(S) : Leyonhjelm et al.

It is certified that error appears in the above-identified patent and that said Letters Patent is hereby corrected as shown below:

In Column 5, Line 3, delete "$[N_{trans}-]$" and insert -- $[N_{trans}-1]$ --, therefor.

In Column 5, Line 4, delete "$[k_{start + (N-1)})]$" and insert -- $[k_{start} + (N-1)]$ --, therefor.

In Column 5, Line 5, delete "$[k_{start + (N-1)})]$" and insert -- $[k_{start} + (N-1)]$ --, therefor.

In Column 10, Line 23, delete "Ntrans-1." and insert -- $N_{trans}-1$. --, therefor.

In Column 10, Line 26, delete "Ntrans-1." and insert -- $N_{trans}-1$. --, therefor.

In Column 12, Line 9, Table VIII, delete "$1 \ ^\dagger \ N_{trans + \Delta + \Delta ext} + \Delta_{comb} \approx N_{trans}$" and insert -- $1 \ ^\dagger \ N_{trans} + \Delta + \Delta_{ext} + \Delta_{comb} \approx N_{trans}$ --, therefor.

Signed and Sealed this

Twentieth Day of November, 2007

JON W. DUDAS
*Director of the United States Patent and Trademark Office*